(12) United States Patent
Kraz et al.

(10) Patent No.: US 12,287,380 B2
(45) Date of Patent: Apr. 29, 2025

(54) SENSOR-BASED PRIVACY-EVENT DETECTION FOR A MOUNTED ELECTRONIC DEVICE

(71) Applicant: Google LLC, Mountain View, CA (US)

(72) Inventors: Mark Benjamin Kraz, Santa Cruz, CA (US); Aditya Shailesh Ghadiali, Mountain View, CA (US); Kok Yen Cheng, San Jose, CA (US); Félix Ambroise Étienne Senepin, San Francisco, CA (US); Chi-Ming Lin, New Taipei (TW)

(73) Assignee: Google LLC, Mountain View, CA (US)

( * ) Notice: Subject to any disclaimer, the term of this patent is extended or adjusted under 35 U.S.C. 154(b) by 153 days.

(21) Appl. No.: 17/815,058

(22) Filed: Jul. 26, 2022

(65) Prior Publication Data

US 2023/0031426 A1     Feb. 2, 2023

Related U.S. Application Data

(63) Continuation of application No. PCT/US2021/044197, filed on Aug. 2, 2021.

(51) Int. Cl.
*H04N 23/667* (2023.01)
*G01D 5/14* (2006.01)
(Continued)

(52) U.S. Cl.
CPC ......... *G01R 33/038* (2013.01); *G01D 5/145* (2013.01); *G01R 33/072* (2013.01);
(Continued)

(58) Field of Classification Search
None
See application file for complete search history.

(56) References Cited

U.S. PATENT DOCUMENTS

| 5,403,782 A | 4/1995 | Dixon et al. |
| 8,934,226 B2 | 1/2015 | Smith |

(Continued)

FOREIGN PATENT DOCUMENTS

| CN | 103269414 | 8/2013 |
| CN | 106534809 | 3/2017 |

(Continued)

OTHER PUBLICATIONS

"International Preliminary Report on Patentability", Application No. PCT/US2021/044197, Jan. 31, 2023, 8 pages.

(Continued)

*Primary Examiner* — Samuel D Fereja
(74) *Attorney, Agent, or Firm* — Colby Nipper PLLC

(57) ABSTRACT

Sensor-based privacy-event detection for a mounted electronic device is described. In aspects, a security system includes a head assembly removably and magnetically coupled to a mounting device having a magnet. The electronic device also includes a camera module and a sensor disposed within the housing. The sensor detects a magnetic field associated with the magnet when the head assembly is coupled to the mounting device. When a user detaches the head assembly from the mounting device (e.g., to recharge the electronic device), the sensor no longer detects the magnetic field and determines the occurrence of a privacy event, which is used to deactivate the camera module to prevent unintentional recordings during the privacy event.

21 Claims, 18 Drawing Sheets

(51) Int. Cl.
*G01R 33/038* (2006.01)
*G01R 33/07* (2006.01)
*G08B 13/14* (2006.01)
*G08B 13/196* (2006.01)
*H04N 23/50* (2023.01)

(52) U.S. Cl.
CPC ..... *G08B 13/149* (2013.01); *G08B 13/19632* (2013.01); *H04N 23/50* (2023.01); *H04N 23/667* (2023.01)

(56) References Cited

U.S. PATENT DOCUMENTS

| | | | |
|---|---|---|---|
| 9,661,235 | B2 | 5/2017 | Petty et al. |
| 10,062,249 | B1 | 8/2018 | Modi et al. |
| 10,319,213 | B1 | 6/2019 | Conner |
| 10,352,496 | B2 | 7/2019 | Mehdi et al. |
| 10,401,710 | B2 | 9/2019 | Wilson et al. |
| 10,418,672 | B2 | 9/2019 | Tso et al. |
| 10,708,472 | B2 | 7/2020 | Jeong et al. |
| 10,718,996 | B2 | 7/2020 | Ramones et al. |
| 10,795,242 | B2 | 10/2020 | Chan et al. |
| 11,277,941 | B1 | 3/2022 | Raghupathy et al. |
| 11,659,677 | B2 | 5/2023 | Kwan et al. |
| 11,852,957 | B2 | 12/2023 | Ali et al. |
| 12,078,694 | B2 | 9/2024 | Ghadiali et al. |
| 12,085,841 | B2 | 9/2024 | Lin et al. |
| 2008/0143525 | A1 | 6/2008 | Woodbury et al. |
| 2011/0079138 | A1 | 4/2011 | Storrie et al. |
| 2011/0149533 | A1 | 6/2011 | Luo et al. |
| 2014/0160250 | A1* | 6/2014 | Pomerantz ............. H04N 23/51 348/222.1 |
| 2014/0253728 | A1 | 9/2014 | Glockler |
| 2015/0022618 | A1 | 1/2015 | Siminoff |
| 2015/0264162 | A1* | 9/2015 | Peng ................... H04M 1/0264 455/575.8 |
| 2016/0043453 | A1 | 2/2016 | Ebner et al. |
| 2016/0083990 | A1 | 3/2016 | Ricks et al. |
| 2016/0157333 | A1 | 6/2016 | Kim et al. |
| 2016/0189502 | A1 | 6/2016 | Johnson et al. |
| 2016/0191864 | A1 | 6/2016 | Siminoff et al. |
| 2017/0031235 | A1 | 2/2017 | Kubotera et al. |
| 2017/0339343 | A1 | 11/2017 | Zhang et al. |
| 2018/0011390 | A1 | 1/2018 | Goulden et al. |
| 2018/0013272 | A1 | 1/2018 | Germe et al. |
| 2018/0143671 | A1 | 5/2018 | Lee et al. |
| 2018/0191930 | A1 | 7/2018 | Jeong et al. |
| 2018/0293860 | A1 | 10/2018 | Britton et al. |
| 2019/0004401 | A1 | 1/2019 | Wilson et al. |
| 2019/0089872 | A1 | 3/2019 | Rukes et al. |
| 2019/0215423 | A1 | 7/2019 | Ortiz et al. |
| 2019/0230259 | A1* | 7/2019 | Germe ................... H04N 23/51 |
| 2019/0373314 | A1 | 12/2019 | Collins et al. |
| 2020/0037471 | A1 | 1/2020 | Kaga |
| 2020/0201144 | A1 | 6/2020 | Ramones et al. |
| 2020/0241396 | A1 | 7/2020 | Park et al. |
| 2022/0091484 | A1 | 3/2022 | Ali et al. |
| 2022/0110228 | A1 | 4/2022 | Raghupathy et al. |
| 2022/0159877 | A1 | 5/2022 | Raghupathy et al. |
| 2022/0268860 | A1 | 8/2022 | Ghadiali et al. |
| 2022/0373870 | A1* | 11/2022 | Law ..................... F16M 11/041 |
| 2023/0384655 | A1 | 11/2023 | Lin et al. |
| 2024/0085766 | A1 | 3/2024 | Ali et al. |
| 2024/0369650 | A1 | 11/2024 | Ghadiali et al. |

FOREIGN PATENT DOCUMENTS

| | | |
|---|---|---|
| CN | 106791337 | 5/2017 |
| CN | 206629176 | 11/2017 |
| CN | 107995393 | 5/2018 |
| CN | 109862329 | 6/2019 |
| CN | 110891135 | 3/2020 |
| CN | 210958525 | 7/2020 |
| CN | 212463322 | 2/2021 |
| EP | 2043067 | 4/2009 |
| EP | 3557552 | 10/2019 |
| JP | 2002369047 A | 12/2002 |
| JP | 2010261801 | 11/2010 |
| JP | 2013065544 A | 4/2013 |
| JP | 5408890 | 2/2014 |
| JP | 2015195132 A | 11/2015 |
| KR | 20180019449 | 2/2018 |
| TW | 201044866 | 12/2010 |
| TW | T202115457 | 4/2021 |
| WO | 2013168391 A1 | 11/2013 |
| WO | 2014138776 | 9/2014 |
| WO | 2014201510 | 12/2014 |
| WO | 2021021918 | 2/2021 |
| WO | 2022066287 | 3/2022 |

OTHER PUBLICATIONS

"International Preliminary Report on Patentability", Application No. PCT/US2021/044194, Mar. 28, 2023, 9 pages.

"Restriction Requirement", U.S. Appl. No. 17/028,456, filed Feb. 24, 2023, 6 pages.

"Ex Parte Quayle Action", U.S. Appl. No. 17/061,872, filed Sep. 16, 2021, 9 pages.

"Extended European Search Report", EP Application No. 21193113.4, Feb. 4, 2022, 10 pages.

"Foreign Office Action", TW Application No. 110141071, Apr. 11, 2022, 7 pages.

"International Preliminary Report on Patentability", Application No. PCT/US2020/044049, Feb. 1, 2022, 9 pages.

"International Search Report and Written Opinion", Application No. PCT/US2021/044197, Apr. 4, 2022, 11 pages.

"International Search Report and Written Opinion", Application No. PCT/US2020/044049, Nov. 19, 2020, 12 pages.

"International Search Report and Written Opinion", Application No. PCT/US2021/044194, Dec. 7, 2021, 12 pages.

"Notice of Allowance", U.S. Appl. No. 17/061,872, filed Dec. 13, 2021, 6 pages.

Orsan, "What's Inside?—vol. 2: Dropcam Pro", https://medium.com/@candemir/whats-inside-vol-2-dropcam-pro-f1458d96ecc9a, Dec. 21, 2014, 23 pages.

"Foreign Office Action", AU Application No. 2021349774, Dec. 5, 2023, 3 pages.

"Foreign Office Action", TW Application No. 110141071, Sep. 7, 2022, 16 pages.

"Foreign Office Action", TW Application No. 110141071, Oct. 2, 2023, 9 pages.

"Non-Final Office Action", U.S. Appl. No. 17/624,967, filed Oct. 2, 2023, 10 pages.

"Notice of Allowance", U.S. Appl. No. 17/028,456, filed Aug. 14, 2023, 10 pages.

"Foreign Office Action", JP Application No. 2023-518271, May 7, 2024, 7 pages.

"Notice of Allowance", U.S. Appl. No. 17/624,967, filed Apr. 1, 2024, 8 pages.

"Notice of Allowance", U.S. Appl. No. 18/027,339, filed May 22, 2024, 8 pages.

"Extended European Search Report", EP Application No. 24192945.4, Oct. 8, 2024, 11 pages.

"Foreign Office Action", GB Application No. 2400858.3, Jul. 18, 2024, 3 pages.

"Foreign Office Action", IN Application No. 202347025479, Aug. 9, 2024, 6 pages.

"Foreign Office Action", CA Application No. 3193111, Sep. 4, 2024, 3 pages.

* cited by examiner

Section 11-11

SENSOR-BASED PRIVACY-EVENT DETECTION FOR A MOUNTED ELECTRONIC DEVICE

RELATED APPLICATION

This application is a continuation of, and claims priority to, PCT Application Number PCT/US2021/044197, filed on Aug. 2, 2021 which is incorporated herein by reference in its entirety.

TECHNICAL FIELD

Systems and techniques are described that relate to a sensor for use in an electronic device including, but not limited to, a security camera module to determine a privacy event when the electronic device is removed from a magnetic mounting device.

BACKGROUND

Usage of video cameras for surveillance or other tasks in residential and commercial environments has increased substantially, in part due to lower costs, the prevalence of sophisticated mobile devices having remote monitoring and control capabilities, and the increased availability of connectivity bandwidth. As consumer demands change and the complexity of security and related systems increases, various new challenges arise in designing such camera products.

Many security cameras, for example, need to be affixed to a surface to ensure stability, however these cameras are physically out in the public and thus can be tampered with or removed. For instance, a camera may be mounted outside of a commercial or residential building and may be adjusted or removed to allow an individual to remain hidden. This can allow individuals to enter a property without being detected, thereby negating the intended purpose of the security camera.

Some security cameras used for residential applications may be battery powered and may need to be temporarily removed, for example, to recharge its battery or clean its lens. In some instances, the user may take the security camera inside their house to charge or clean it. Operating the security camera when the camera is unmounted (e.g., while recharging the battery or cleaning the lens inside the user's house) may present privacy concerns for the user and/or may unnecessarily consume power and data storage.

BRIEF SUMMARY

Implementations of the described systems and techniques are directed to sensor-based privacy-event detection for a mounted electronic device. In aspects, an electronic device includes a head assembly removably and magnetically coupled to a mounting device having a magnet. The electronic device also includes a camera module and a sensor disposed within the housing. The sensor detects a magnetic field associated with the magnet when the head assembly is coupled to the mounting device. More particularly, the sensor is configured to detect a magnetic field strength value associated with the magnet, i.e. a value of the strength of the magnetic field or a value associated with the strength of the magnetic field (such as a voltage or a current produced by the sensor when detecting the magnetic field). When a user detaches the head assembly from the mounting device (e.g., to recharge the electronic device), the sensor no longer detects the magnetic field and the occurrence of a privacy event is determined, which is used to deactivate the camera module to prevent unintentional recordings during the privacy event.

In implementations, a method is described for detecting a privacy event associated with an electronic device having a head assembly removably and magnetically coupled to a mounting device. The method includes detecting, via a sensor disposed within the electronic device, a magnetic field strength value associated with a magnet when the head assembly is coupled to the mounting device. The method also includes, responsive to no longer detecting the magnetic field strength value associated with the magnet, determining that the head assembly is decoupled from the mounting device. In addition, the method includes detecting the privacy event based on the decoupling of the head assembly from the mounting device (i.e. whether the decoupling of the head assembly from the mounting device is based on a privacy event). The method further includes responsive to detecting the privacy event, deactivating a camera module disposed within the electronic device.

A "privacy event" may be present if a user of the electronic device deliberately decouples the head assembly from the mounting device (e.g. for maintenance). For example, the method may further include, responsive to detecting the magnetic field strength value associated with the magnet, activating the camera module to capture images of a scene.

The method may further include, subsequent to deactivating the camera module: detecting a new magnetic field strength value associated with the magnet or another magnet; determining that the head assembly has been recoupled to the mounting device or coupled to another mounting device based on detecting the new magnetic field strength value associated with the magnet or the other magnet; and responsive to determining that the head assembly has been recoupled to the mounting device or coupled to the other mounting device, reactivating the camera module.

The sensor may be one of a magnetometer, a magnetoresistive sensor, and a Hall effect sensor.

The method may further include: obtaining sensor data from one or more additional sensors; and inferring, based on the sensor data, whether the electronic device is located indoors or outdoors.

The method may further include: determining that the decoupling of the head assembly from the mounting device is not a tamper event; and responsive to determining that the decoupling of the head assembly from the mounting device is not a tamper event and based on an inference that the electronic device is outdoors, associating the decoupling of the head assembly from the mounting device with the privacy event.

The method may further include detecting a signal, via a connector subassembly located on the head assembly, from a coupler directly connected to the connector subassembly, the connector subassembly having contacts that are exposed to air and that directly contact pins on the coupler to receive electrical signals.

The connector subassembly may include a printed circuit board and the contacts may be part of the printed circuit board.

The method may further include using a first plurality of the contacts for USB negotiation and a second plurality of the contacts for accessory detection and identification.

The method may further include: detecting, using the second plurality of metallic contacts, a resistor value; and identifying which accessory device from a plurality of accessory devices is connected to the head assembly based on the resistor value being associated with the accessory device.

The method may further include adjusting a function based on which accessory device is identified as being connected to the head assembly.

The adjusting a function may include decreasing a time between motion detection.

The adjusting a function may include increasing a length of a video clip recording.

The adjusting a function may include increasing a brightness of one or more light-emitting diodes (LEDs).

The method may further include notifying an end user having an application associated with the electronic device that the privacy event has been detected and the head assembly has been decoupled from the mounting device.

In some implementations, an electronic device is described. The electronic device includes a head assembly removably and magnetically coupled to a mounting device having a magnet. The head assembly may include a housing, a camera module disposed within the housing and configured to capture images or video, and a sensor disposed within the housing and configured to detect a magnetic field strength value associated with the magnet. The electronic device further comprises at least one electronic circuit configured to determine that the head assembly is decoupled from the mounting device responsive to the sensor no longer detecting the magnetic field strength value associated with the magnet; detect a privacy event based on the decoupling of the head assembly from the mounting device; and deactivate the camera module responsive to detecting the privacy event. The at least one electronic circuit may be part of the sensor or external to the sensor. Further, embodiments described above in conjunction with the method for detecting a privacy event may be used analogously to implement the electronic device. For example, if the electronic circuit detects or has received the information that a tamper detection is disarmed when the head assembly is decoupled from the mounting device, the decoupling of the head assembly from the mounting device may be associated with the privacy event (i.e. the decoupling of the head assemble will be detected to be based on a privacy event).

BRIEF DESCRIPTION OF THE DRAWINGS

For a better understanding of the various implementations described and shown herein, reference should be made to the Detailed Description of implementations below, in conjunction with the following drawings in which like reference numerals refer to corresponding parts throughout the figures.

DETAILED DESCRIPTION

Figure 1A:
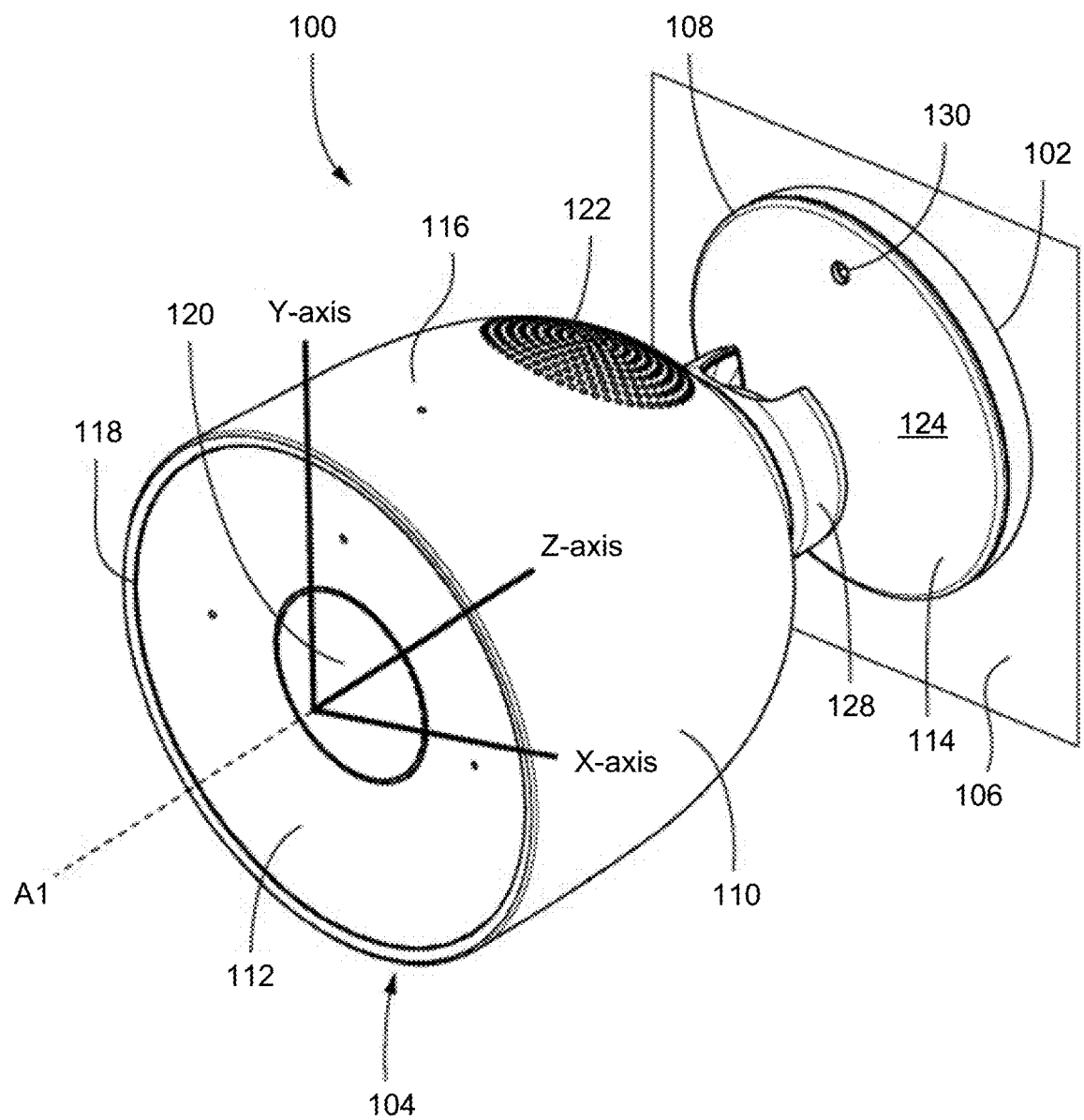
FIG. 1A is a perspective view of a system including an electronic device (e.g., a camera module) with a mount in accordance with some implementations.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Referring to the drawings in detail, wherein like reference numerals indicate like elements throughout, there is shown in FIGS. 1A-4, 6, 7, and 10-12 security system 100, which may be a camera system according to some implementations, which generally includes mounting plate 102 or mounting device 600 connected to head assembly 104, which may include an electronic device. In some implementations, head assembly 104 is or includes a camera module configured to capture video and/or still photographs. Head assembly 104 may be coupled to a surface, such as surface 106, using a mounting device. In some implementations, the mounting device is mounting plate 102. In other implementations, the mounting device is stand 108. In yet another implementation, the mounting device is stand 108 coupled to mounting plate 102. In further implementations, the mounting device is mounting device 600.

Referring to FIGS. 1A-4, head assembly 104 may include stand 108, housing 110, front element 112, sensor 400, and accelerometer 402. Head assembly 104 may be coupled to mounting plate 102 via stand 108, which may include base assembly 114. For example, housing 110 may be coupled to stand 108, which may be coupled to mounting plate 102. In some implementations, head assembly 104 may be coupled directly to mounting plate 102. In some implementations, head assembly 104 may be removably coupled to mounting plate 102 and/or stand 108. In one implementation, head assembly 104 may be removably coupled to the stand 108 by, for example, a magnet. An example described in more detail with respect to FIG. 6 includes head assembly 104 magnetically coupled to mounting device 600.

In some implementations, security system 100 may be used, for example, as a component of a residential or commercial surveillance system. In some implementations, head assembly 104 alternatively or additional includes one or more audio devices (e.g., speaker, microphone). In further implementations, head assembly 104 additionally or alternatively includes a light source (e.g., light bulb, light emitting diode (LED), laser, etc.). Other electronic devices may also be included in head assembly 104 according to further implementations. In alternative implementations, security system 100 is primarily, or exclusively, a speaker, microphone, sensor, and/or light system.

Referring to FIGS. 1A-3, head assembly 104, in some implementations, includes housing 110, which surrounds and protects the internal components of the electronic device. For example, housing 110 may protect the components stored within head assembly 104. In some implementations where head assembly 104 is or includes a camera module, the various components of the camera module (e.g., CPU(s), memory, data input device(s), data output device(s), lens assemblies, heat sink(s), image sensor array(s), infrared illuminator(s), filter(s), sensor(s) etc.) may be enclosed within housing 110. In some implementations, housing 110 may include a generally cup-shaped shell, which surrounds and defines an interior space in which the electronic device or components thereof may be housed. In some implementations, housing 110 may be bell-shaped or include a shape such as a circular paraboloid. Other shapes for housing 110 may also be utilized according to alternatively implementations. Housing 110 may have a continuously convexly curved exterior surface, which defines exterior surface 116 of head assembly 104.

Referring to FIG. 1A, housing 110 may include a shape that is generally symmetric about central axis A1 of head assembly 104. Head assembly 104 may include a camera module having an optical axis, and central axis A1 of head assembly 104 may be coaxial with an optical axis of the camera module. The optical axis of the camera module may refer to the axis about which the one or more lenses of the camera module are centered. In some implementations, head assembly 104 further includes front element 112, which is sized and shaped to fit or substantially fill front end 118 of housing 110. Front element 112 may include central portion 120. In some implementations, front element 112 and central portion 120 may both be circular and central portion 120 may be concentric with front element 112. In some implementations, front element 112 is secured to front end 118 of housing 110 with a water resistant or waterproof seal. In some implementations, where head assembly 104 is or includes a camera module, front element 112 may be positioned at front end 118 of the camera module and be positioned to face a subject being videoed and/or photographed by the camera module during use. For example, in use camera module may have a field of view and when a subject is within the field of view, front end 118 may be positioned to face the subject. In further implementations, housing 110 includes a speaker and/or microphone grille 122 to allow transmission of sound to or from the electronic device disposed within in head assembly 104.

In certain implementations, head assembly 104 may include one or more lights (e.g., LEDs), which are configured to emit light through front element 112. In some implementations, the one or more lights may be configured to emit different colors that, for example, may be indicative of a status or operational mode of security system 100. In some implementations, the one or more lights are arranged to emit light proximate the perimeter of front element 112, for example, to produce a ring of light around central portion 120 of front element 112 or in response to an alert as discussed in further detail below. In some implementations, front element 112 may be configured to diffuse or soften the light emitted by the one or more lights. In some implementations, central portion 120 is configured to not diffuse or scatter light, and a portion of front element 112 around central portion 120 may be configured to diffuse or scatter light. Central portion 120 may be disposed about central axis A1 (e.g., coaxial with an optical axis of the camera) according to some implementations.

Referring to FIG. 1A, head assembly 104 is configured to be affixed to surface 106 (e.g., building wall, ceiling, overhang, column, etc.) by mounting plate 102. In some implementations, mounting plate 102 can be affixed to surface 106. In some implementations, housing 110 of head assembly 104 is configured to move relative to mounting plate 102. In some implementations, housing 110 is configured to move relative to mounting plate 102 in at least one degree of freedom. In some implementations, housing 110 is configured to move relative to mounting plate 102 in at least two degrees of freedom. In some implementations, housing 110 is configured to move relative to mounting plate 102 in three or at least three degrees of freedom. Housing 110 may be configured to be pivotably movable relative to mounting plate 102. In some implementations, housing 110 of head assembly 104 may be configured to move relative to stand 108.

Figure 1B:
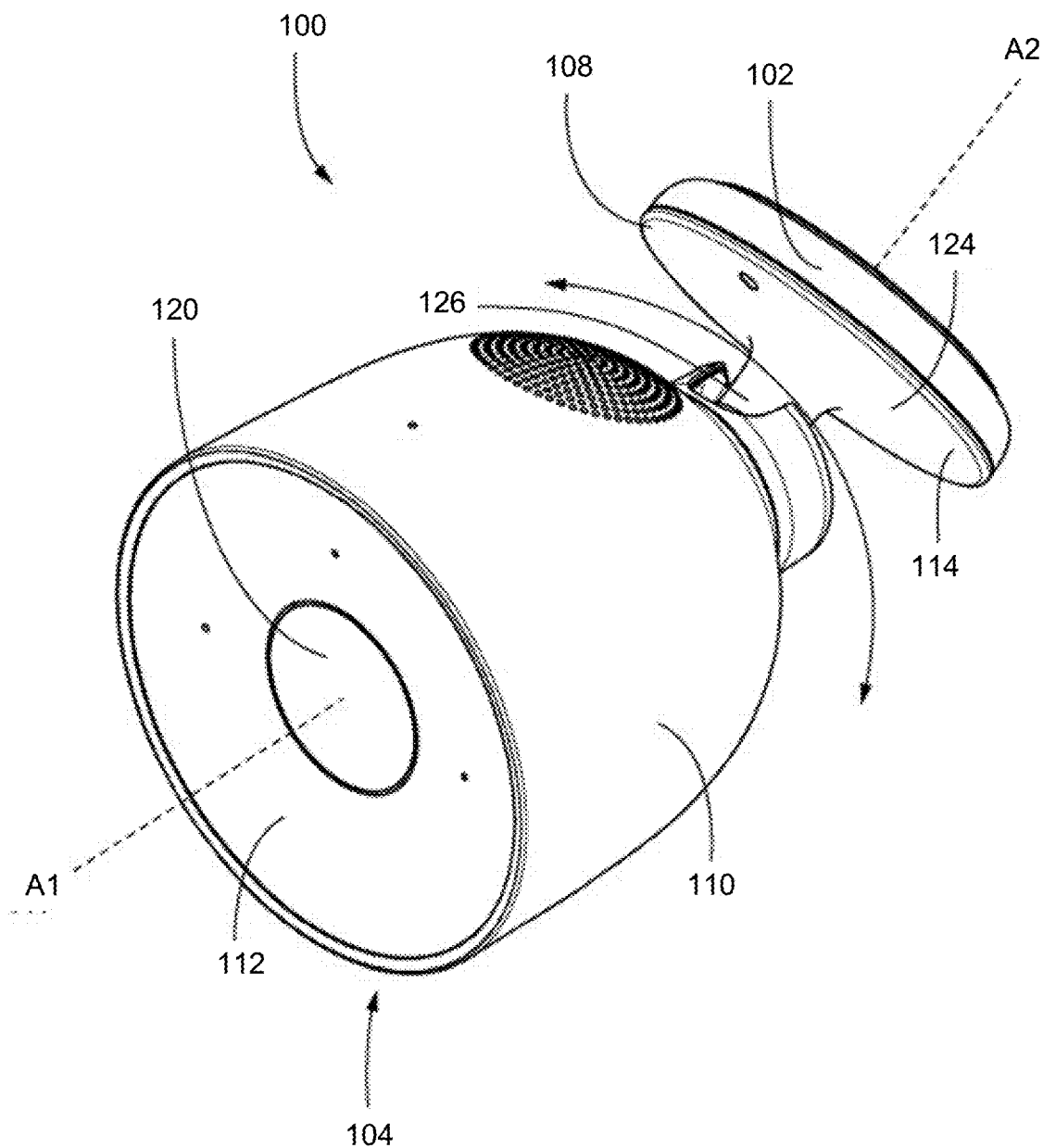
FIG. 1B is a perspective view of the system of FIG. 1A where the electronic device in a tilted positioned in accordance with some implementations.
Figure 1C:
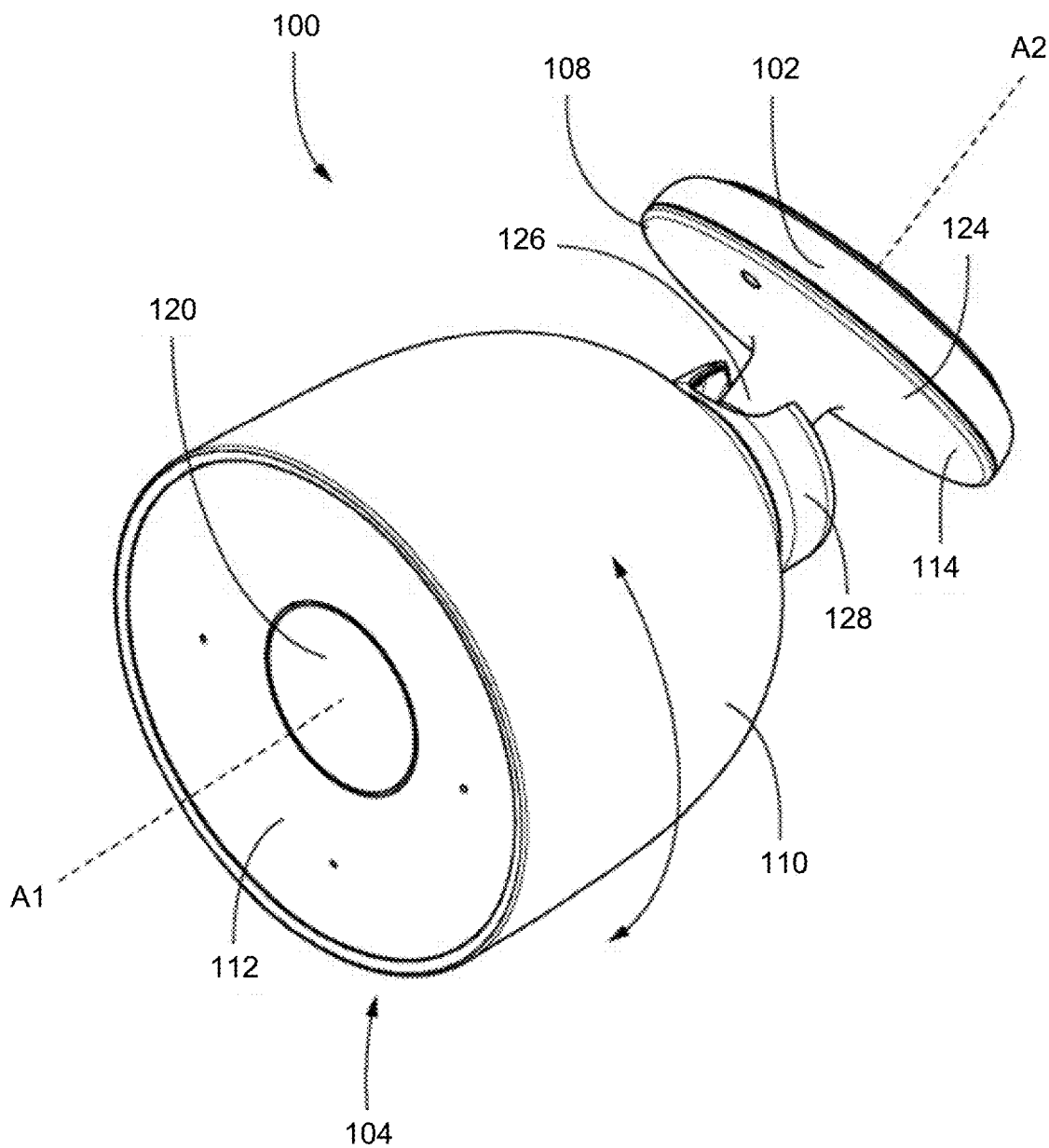
FIG. 1C is a perspective view of the system of FIG. 1A where the electronic device in a tilted and rotated positioned in accordance with some implementations.
Figure 4:
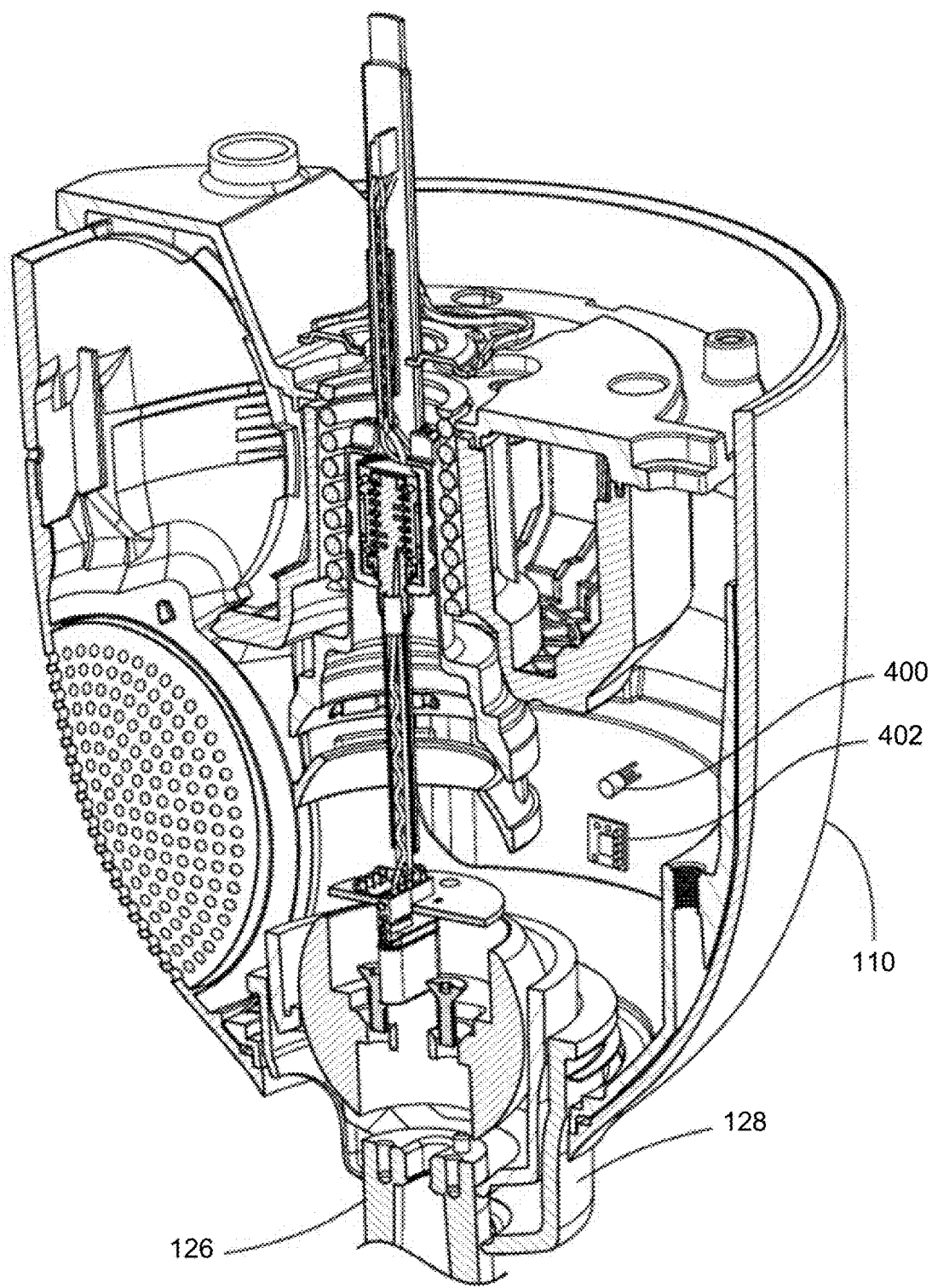
FIG. 4 is a partial exploded cutaway perspective side view of the system of FIG. 1A showing components of a hinge assembly in accordance with some implementations.

Referring to FIGS. 1B-1C and 4, stand 108 may include base assembly 114. In some implementations, base assembly 114 includes external surface 124 and stem 126, which extends from external surface 124. Housing 110 may be coupled to stand 108 via stem 126. Stem 126 may extend perpendicularly from a portion of external surface 124 (e.g., a central portion). Stem 126 may couple with housing 110 to form a hinge assembly. The hinge assembly formed by stem 126 and housing 110 may be a ball-and-socket joint. Stem 126 may couple to housing 110 such that housing 110 is selectably fixed relative to stem 126. In some implementations, stem 126 is coupled to housing 110 such that housing 110 is fixed relative to stem 126. In some implementations, stem 126 is coupled to housing 110 by a fastener or fastening device, such as a magnet. In some implementations, stem 126 is disposed about and extends along an axis A2. In some implementations, housing 110 is configured to tilt and/or rotate with respect to stem 126, as depicted by the arrows shown in FIG. 1B. In some implementations, housing 110 is configured to tilt with respect to stem 126 with a range of motion between 45° to 90°, 50° to 85°, 55° to 80°, 60° to 75°, or 65° to 70°. In some implementations, housing 110 may be coupled to collar 128. Housing 110 may be further configured to rotate relative to collar 128 about central axis A1 of housing 110 (e.g., clocking motion), as depicted by the arrows shown in FIG. 1C and as discussed in further detail below. As mentioned previously, where housing 110 includes a camera module, central axis A1 of housing 110 may be coaxial with the optical axis of the camera module. In some implementations, housing 110 may rotate about central axis A1 of housing 110 with no limit to the range of rotation.

Referring to FIG. 1A, base assembly 114 further includes a release mechanism that is configured to allow head assembly 104 to be disengaged from mounting plate 102. In some implementations, the release mechanism requires a separate tool to actuate. In some implementations, the release mechanism may be accessed by a user through opening 130 in external surface 124 of base assembly 114. In some implementations, the release mechanism requires the separate tool to be inserted into opening 130 in order to be actuated, causing head assembly 104 to disengage from mounting plate 102. In some implementations, the release mechanism requires a tool to be inserted into opening 130 and rotated. Similar to a security screw, opening 130 in some implementations may be shaped such that only a tool having a specific predetermined shape (e.g., specific cross-sectional shape) may fit in opening 130 and actuate the release mechanism. Requiring a specific shape for the tool, particularly a less common shape, may help prevent unauthorized removal of head assembly 104 from mounting plate 102 according to some implementations. In some implementations, the release mechanism may be designed to require a wrench or driver having one of, for example, a hex, torx, square, triangular, pentalobe, polydrive, torq-set, or any other shape known for driving security screws. In some implementations, the tool is a hex key. In some implementations, opening 130 is configured such that a flathead or Phillips screw driver will not be able to actuate the release mechanism.

Figure 2:
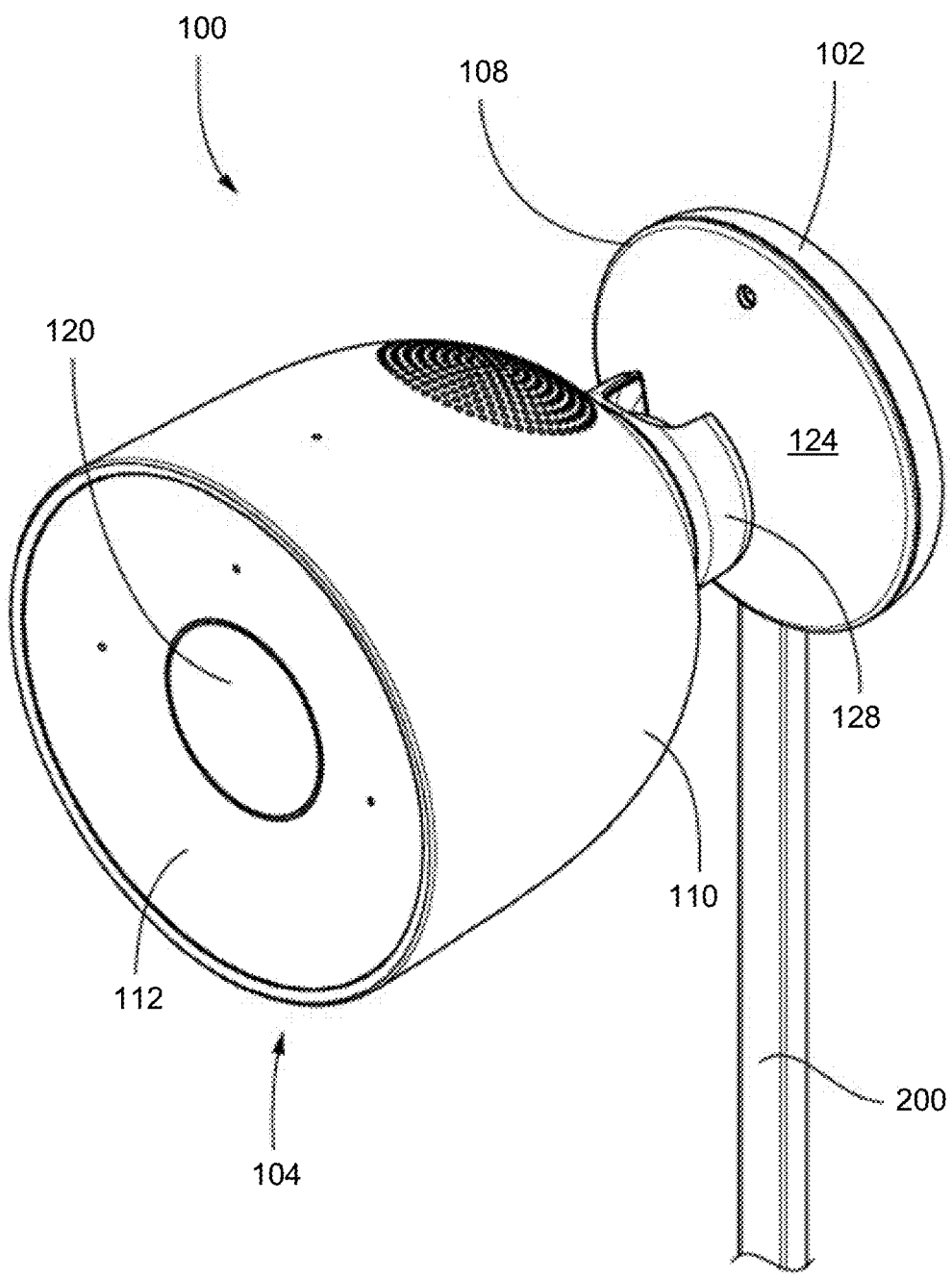
FIG. 2 is a perspective view of the system of FIG. 1A connected to a cable in accordance with some implementations.
Figure 3:
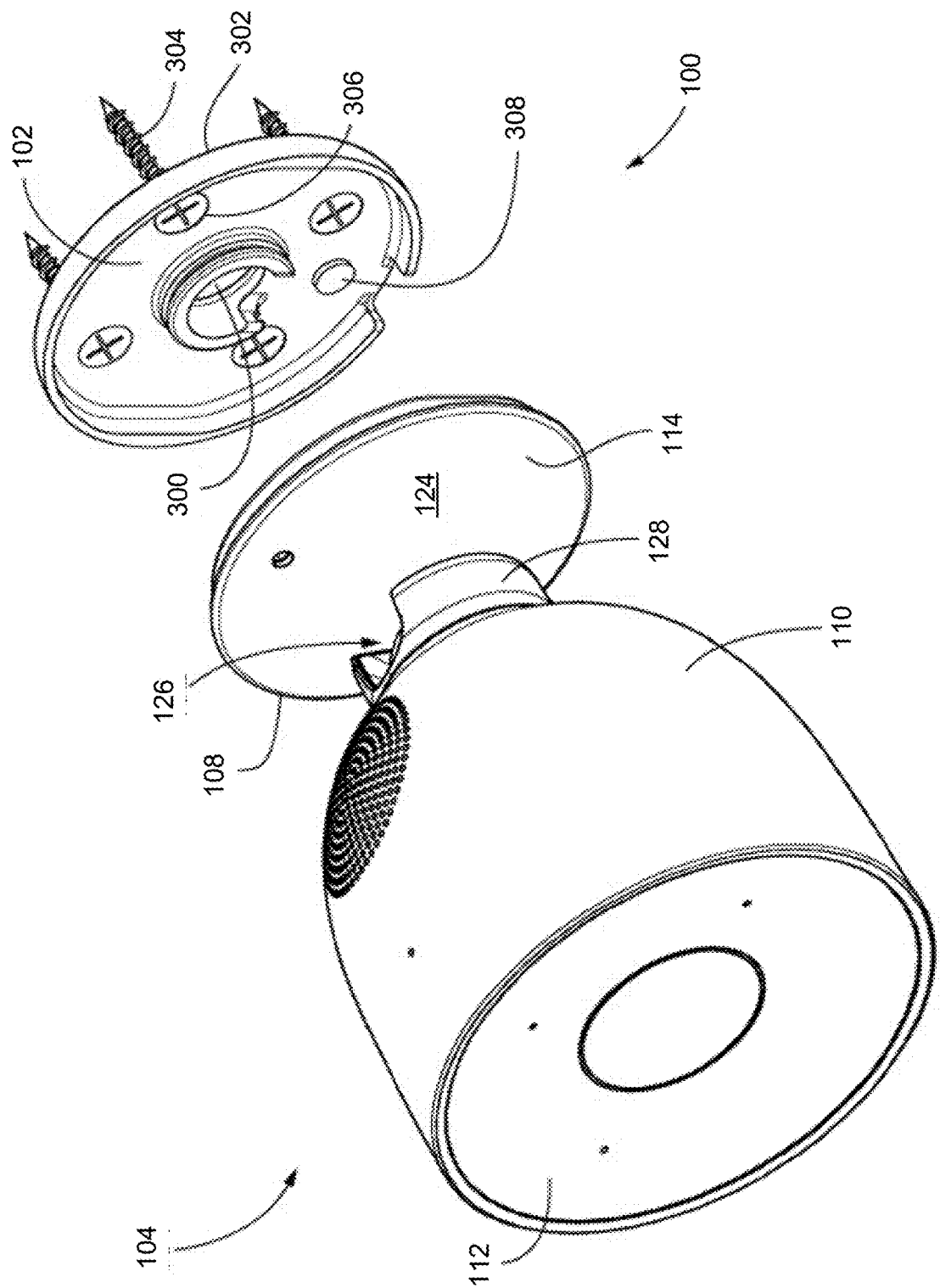
FIG. 3 is an exploded front perspective view of the system of FIG. 1A with the mounting plate separated from the base assembly and provided with fasteners in accordance with some implementations.

Referring to FIGS. 2 and 3, security system 100 may be configured to electronically connect with an external electronic device (not shown), which may be, for example, an electronic power source, computer, portable electronic device, component of a smart home network, etc. In some implementations, security system 100 is configured to communicate data with one or more smart devices, a central server or cloud-computing system, and/or other devices that are network-connected. In some such implementations, security system 100 is configured to electronically connect with the external electronic device through a wired connection (e.g., a universal serial bus (USB) cable) that passes through mounting plate 102 and into base assembly 114. The wired connection may allow both power and data transmission between the external electronic device and security system 100. In certain implementations, as will be described further herein, the connection of security system 100 to any cables may be concealed. In some implementations, concealing the cable may help protect the cables and prevent tampering and disablement of security system 100 during use. The cable of security system 100 may be covered by cable cover 200 to protect security system 100 from outdoor elements, such as weather, debris, or animals, or to protect the cable from tampering. In some implementations, the cable may pass through back opening 300 of mounting plate 102.

Referring to FIG. 1A, security system 100 may be a wireless system such that a physical wired connection between security system 100 and the external device is not required. In some such implementations, security system 100 may include a self-contained battery or energy storage device (e.g., batter) capable of providing power to electronic components of security system 100. In further implementations, security system 100 includes modules for the wireless transmission of data to the external device. In some implementations, security system 100 is configured to wirelessly communicate data with one or more smart devices, a central server or cloud-computing system, and/or other devices that are network-connected. Data communications may be carried out using any of a variety of custom or standard wireless protocols (e.g., IEEE 802.15.4, Wi-Fi, ZigBee, 6LOWPAN, Thread, Z-Wave, Bluetooth, ISA100.11a, WirelessHART, MiWi, etc.) and/or any of a variety of custom or standard wired protocols (e.g., Ethernet, HomePlug, etc.), or any other suitable communication protocol.

Referring to FIGS. 1A and 3, mounting plate 102 may be secured to surface 106, which may be a wall, ceiling, or other location where security system 100 may be mounted before engagement with base assembly 114. In some implementations, stand 108 of head assembly 104 may be configured to couple head assembly 104 to mounting plate 102, thereby coupling head assembly 104 to surface 106. Mounting plate 102 may include back surface 302, which may be positioned to abut surface 106, such as a wall or other surface and may be secured thereto using one or more mechanical fasteners 304 (e.g., screws, nails, bolts, pins, etc.). Fasteners 304 may be received through one or more fastener holes 306 provided on mounting plate 102 which, for example, may be arranged around back opening 300. In some implementations, back opening 300 may be, but not necessarily, positioned centrally between two or more of fastener holes 306. Fasteners 304 may be, in some implementations, screws having heads which are configured to be concealed between mounting plate 102 and base assembly 114. In some implementations, back surface 302 may be provided or coated with an elastomeric material (e.g., silicone, rubber, etc.) that is configured to form a seal and/or provide for vibration absorption against the wall, ceiling, or other surface to which security system 100 is to be mounted. In some implementations, back surface 302 may be adhered or secured to the wall or other surface with any other suitable means known to those skilled in the art (e.g., via hook-and-loop fasteners, magnetic fasteners, etc.).

In some implementations, at least a portion of mounting plate 102 may be made of magnetically attractable material, which may be magnetically coupled to a magnetic surface to affix mounting plate 102 and security system 100 to the magnetic surface. In some implementations, mounting plate 102 may include one or more magnets (not shown) for attaching mounting plate 102 onto surface 106, which may be a certain magnetic or metal supporting surface. The magnet, according to some implementations, may be disposed adjacent to or may form a portion of mounting plate 102. In some implementations, the magnet includes a magnetic plate.

Referring particularly to FIGS. 3 and 4, in some implementations, security system 100 may include magnet 308 (FIG. 3) and sensor 400 (FIG. 4). The sensor 400 may be disposed within housing 110 of head assembly 104 and may be configured to detect motion of the head assembly 104 relative to the mounting plate 102. In some implementations, sensor 400 may disposed within stand 108 or on a bottom surface of base assembly 114. In practice, information regarding the movement of housing 110 and/or head assembly 104 relative to mounting plate 102 is useful to verify whether housing 110 and/or head assembly 104 have been re-positioned or tampered with by a potential intruder. For example, an intruder may remove head assembly 104 from mounting plate 102, which may be affixed to surface 106, to prevent the camera module within housing 110 from recording their activity. The removal of head assembly 104 may be detected by sensor 400. By way of another example, an intruder may rotate housing 110 of head assembly 104 to reposition housing 110 to avoid recording activity within the original field of view of the camera module disposed within housing 110, thereby allowing the intruder and/or his/her associates to avoid being recorded. In yet another example, a potential intruder may remove head assembly 104 from mounting plate 102, and then place head assembly 104 back to its original position. The removal of head assembly 104 may be detected by sensor 400 and relayed to the owner, even though head assembly 104 was returned to its original position. Sensor 400 may be used to indicate tampering of head assembly 104 and may trigger a notification and/or action as discussed in further detail below. In some implementations, sensor 400 is disposed within housing 110 of head assembly 104 adjacent collar 128 and stand 108. Sensor 400 may be coupled to an internal structure of head assembly 104 by an adhesive, soldering, fasteners, or any other method of coupling sensor 400 to an internal structure of head assembly 104.

In some implementations, magnet 308 (FIG. 3) is provided to add a strong magnetic field to enhance the sensitivity of the sensor 400. In some implementations, magnet 308 provides mounting purposes as well, as discussed above. Magnet 308 may be coupled to mounting plate 102 such that magnet 308 is disposed within mounting plate 102. Magnet 308 may be coupled to mounting plate 102, disposed within mounting plate 102, or disposed on mounting plate 102. Magnet 308 may be coupled to mounting plate 102 via an adhesive, fastener, or magnetic attraction. In some implementations, magnet 308 may be sized and shaped to fit within mounting plate 102, between fastener holes 306. Magnet 308 may be configured to generate a magnetic field having a value that does not affect or impair the functioning of other elements of security system 100, such as the camera module. In some implementations, multiple magnets similar to magnet 308 may be used, which may be disposed throughout mounting plate 102. In some implementations, mounting plate 102 may include multiple types of magnets. For example, mounting plate 102 may include one type of magnet for affixing mounting plate 102 to surface 106 and another type of magnet similar to magnet 308 for generating magnetic strength field values detected by sensor 400. In some implementation's, the magnet for affixing mounting plate 102 to surface 106 and the magnet or generating magnetic strength field values detected by sensor 400 are the same magnet.

In some implementations, sensor 400 may be disposed within housing 110 of head assembly 104 and magnet 308 may be disposed within mounting plate 102. In alternative implementations, sensor 400 may be disposed within mounting plate 102 and magnet may be disposed within housing 110. Sensor 400 may be fixedly coupled to the interior of housing 110. In some implementations, sensor 400 may be configured to remain in a fixed location relative to housing 110 and/or head assembly 104. Sensor 400 may be configured to detect magnetic field strength values generated by, for example, magnet 308. In some implementation, sensor 400 is a tamper detection sensor configured to detect various positions of head assembly 104 relative to mounting plate 102. Sensor 400 may detect various positions of head assembly 104 relative to mounting plate 102 based on magnetic field strength values generated by magnet 308 within mounting plate 102 and detected by sensor 400 based on the position of head assembly 104 relative to mounting plate 102. For example, sensor 400 may detect translation of head assembly 104 and/or rotation of housing 110 relative to mounting plate 102 based on changes to the magnetic field strength values generated by magnet 308 disposed within mounting plate 102. In addition, sensor 400 may detect removal of head assembly 104 from the mounting plate 102 based on changes to the magnetic field strength values generated by magnet 308 disposed within mounting plate 102.

In some implementations, security system 100 may include accelerometer 402, which may be an electronic compass. Accelerometer 402 may work in conjunction with sensor 400 and may provide acceleration information relating to the movement and acceleration of housing 110. Accelerometer 402 may be configured to detect repositioning of housing 110. In some implementations, accelerometer 402 may be a 3-axis accelerometer. In some implementations, accelerometer 402 may include a 3-axis gyroscope. In some implementations, accelerometer 402 may be a part of sensor 400. For example, sensor 400 may include a magnetometer, accelerometer 402, and the 3-axis gyroscope. Accelerometer 402 may be beneficial when sensor 400 and magnet 308 are aligned along the same axis. For example, when sensor 400 and magnet 308 are aligned along the same axis, sensor 400 may not be able to determine changes in magnetic field strength values of magnet 308, thus may utilize accelerometer 402 to help determine whether housing 110 has moved relative to mount. In some implementations, accelerometer 402 may notify a user when the entirety of security system 100 has been moved or removed from surface 106. For example, removing the entirety of security system 100 may result in sensor 400 not detecting a change in magnetic field strength values from magnet 308 due to magnet 308 and sensor 400 not moving relative to one another. Thus, accelerometer 402 may be able to detect movement when the position of magnet 308 relative to sensor 400 is unchanged.

Further, existing sensors used for tamper detecting require an additional power source and can be expensive. For example, existing tamper prevention methods may utilize magnetic switches to determine whether a security camera has been tampered with. However, these magnetic switches only work along a single axis. Further, magnetic switches do not engage in all situations, thereby allowing for false negatives or may be manipulated by using an additional magnet to trick the sensor. In addition, some detectors for detecting tampering require compromising the industrial design. For example, some detectors require a viewing window or an optical sensor that requires apertures to be cut into the existing housing. This can be undesirable since it is necessary to know whether a device such as a security camera has been tampered with.

In some implementations, sensor 400 may be disposed in housing 110 and may be a 3-axis magnetometer to detect the strength of magnetic field with increased sensitivity. Sensor 400 may be disposed in housing 110 without compromising the industrial design of housing 110 or without the need for creating apertures or windows within housing 110. In some implementations, sensor 400 may be a Hall Effect sensor or a magnetoresistive sensor such as an anisotropic magnetoresistive sensor, a giant magnetoresistive sensor, or a tunneling magnetoresistive sensor. Sensor 400 may be a 3-axis sensor to provide greater sensitivity in detecting a change in the magnetic field strength through change in the position of head assembly 104 relative to mounting plate 102. In some implementations, sensor 400 detects magnetic field vectors (field strength and direction). Sensor 400 may be configured to sense change in position of head assembly 104 relative to mounting plate 102 based on changes in magnetic field strength values along the X-axis, Y-axis, and Z-axis (FIG. 1A). In some implementations, sensor 400 alone, or sensor 400 in conjunction with accelerometer 402, may detect changes in position of head assembly 104 based on acceleration information from accelerometer 402 and the orientation of sensor 400 relative to Magnetic North of Earth's magnetic field and/or relative to magnet 308. For example, sensor 400 may notify a user when the entirety of security system 100 has been moved or removed from surface 106. For example, removing the entirety of security system 100 may result in sensor 400 not detecting a change in magnetic field strength values from magnet 308 due to magnet 308 and sensor 400 not moving relative to one another. However, sensor 400 may be able to detect a change due to Earth's magnetic field when moved from an initial position, thus detecting when the position of security system 100 has altered.

In some implementations, a user may set an initial baseline value based on a magnet field strength value acquired by sensor 400 when head assembly 104 is initially coupled to mounting plate 102, which is affixed to surface 106. In some implementations, sensor 400 may detect a magnetic field strength value at a specific frequency and compare this value to the initial baseline. For example, sensor 400 may detect a magnetic strength field value at frequency of 5 Hz for one second and compare this value to the initial baseline previously determined, as discussed below. In some implementations, sensor 400 may detect a magnetic strength field value at frequency of approximately 1 Hz, approximately 2 Hz, approximately 3 Hz, approximately 10 Hz, approximately 15 Hz, approximately 20 Hz, approximately 25 Hz, approximately 50 Hz, approximately 75 Hz, approximately 100 Hz, or greater than 100 Hz. In preferred implementations, sensor 400 may detect a magnetic strength field value at a frequency of 20 Hz.

In some implementations, sensor 400 may be calibrated to sense the position of sensor 400 within housing 110 relative to Earth's magnetic field. For example, when head assembly 104 is in an initial position, after installation, sensor 400 may detect an initial magnetic field strength value based on Earth's magnetic field, such as Magnetic North, and may set this initial reading as the baseline for sensor 400. In some implementations, sensor 400 detects the baseline after approximately 6 hours, 12 hours, 24 hours, 36 hours, 48 hours, 60 hours, or 72 hours. When head assembly 104 is removed from mounting plate 102 or substantially changes locations (i.e., removed from the surface that head assembly 104 and mounting plate 102 are affixed to), sensor 400 may detect another magnetic field strength value based on Earth's magnetic field that is a deviation from the initial baseline. In some implementations, calibrating sensor 400 based upon Earth's magnetic field allows sensor 400 to detect when head assembly 104 has changed positions. For example, an intruder may remove head assembly 104 and sensor 400 from mounting plate 102, which removes power from head assembly 104 and the camera module thereby resulting in security system 100 not being able to capture video. After the intruder has finished their activities, the intruder may place head assembly 104 back onto mounting plate 102 in its original position. Due to sensor 400 detecting changes in magnetic field strength values relative to Earth's magnetic field, sensor 400 can detect that the position of head assembly 104 has been tampered with.

In some implementations, sensor 400 and magnet 308 may be initially positioned to align with Magnetic North of Earth's magnetic field. In this implementation, sensor 400 being a 3-axis sensor allows sensor 400 to rely primarily on the deviation of the magnetic field strength of magnet 308 along the X-axis, Y-axis, and Z-axis to determine movement of head assembly 104, instead of relying solely on the detection of Earth's magnetic field by sensor 400. In some implementations, once head assembly 104 is decoupled from mounting plate 102, sensor 400 may no longer detect magnetic field strength values until head assembly 104 has been re-coupled to mounting plate 102.

In some implementations, sensor 400 may have a sensitivity to detect movement of head assembly 104 away from mounting plate 102 at various distances. For example, sensor 400 may detect when head assembly 104 is moved at least 0.1 cm, 0.2 cm, 0.3 cm, 0.4 cm, 0.5 cm, 0.6 cm, 0.7 cm, 0.8 cm, 0.9 cm, 1 cm, 2 cm, 3 cm, 5 cm, or 10 cm away from mounting plate 102. In preferred implementations, sensor 400 may detect when head assembly 104 is moved at least 0.75 cm. In some implementations, sensor 400 may have a sensitivity to detect rotation of housing 110 of head assembly 104 relative mounting plate 102 at various degrees of rotation. For example, sensor 400 may detect when housing 110 has been rotated at least 5°, 6°, 7°, 8°, 9°, 10°, 15°, 30°, 35°, 40°, or 45° about the X-axis, Y-axis, and Z-axis relative to mounting plate 102. In preferred implementations, sensor 400 may detect when housing 110 is rotated at least 10° relative to mounting plate 102.

In some implementations, sensor 400 and the magnet 308 are mutually configured and dimensioned such that the sensor 400 can detect a change in orientation of sensor 400 relative to magnet 308. In some implementations, head assembly 104 is directly coupled to mounting plate 102 via a magnet. In some implementations, magnet 308 may be the same magnet that is used to couple head assembly 104 to mounting plate 102 or the same magnet used to couple mounting plate 102 to surface 106 for affixing mounting plate 102 to surface 106. In some implementations, magnet 308 may be the same magnet used to couple head assembly 104 to stand 108.

In some implementations, magnet 308 may be a rare earth metal. In some implementations, the thickness and diameter of magnet 308 may be determined based on the strength of the magnetic field of magnet 308 desired. Magnet 308 may generate a strong magnetic field having a specific strength, which may be detected by sensor 400. Magnet 308 generating a strong magnetic field allows sensor 400 to operate with increased sensitivity due to smaller changes in the magnetic field strength values of magnet 308 being more detectable by sensor 400. In some implementations, sensor 400 being a 3-axis sensor results in sensor 400 detecting the magnetic field strength value along the X-axis, Y-axis, and Z-axis, thereby obtaining three magnetic field strength values for the reading of the magnetic field strength value of each of the X-axis, Y-axis, and Z-axis.

In some implementations, when head assembly 104 is initially coupled to mounting plate 102 in an initial position, sensor 400 may determine an initial orientation baseline based on the position of sensor 400 relative to magnet 308. Sensor 400 may determine the initial orientation baseline based on the magnetic field strength value of magnet 308 detected by sensor 400. In some implementations, sensor 400 may determine the initial orientation baseline after approximately 1 minute, 2 minutes, 3 minutes, 5 minutes, 10 minutes, 30 minutes, or 60 minutes. In some implementations, rotation of housing 110 of head assembly 104 causes rotation of sensor 400 relative to magnet 308, thereby changing the value of the magnetic field strength value detected by sensor 400 compared to the initial orientation baseline value. The change in the value of the magnetic field strength may occur in the X-axis, the Y-axis, or the Z-axis, thereby allowing sensor 400 to determine the manner in which housing 110 was rotated relative to magnet 308. In some implementations, sensor 400 may primarily rely on the change in orientation of sensor 400 relative to magnet 308 when head assembly 104 is coupled to mounting plate 102. When head assembly 104 is decoupled from mounting plate 102, sensor 400 may not be able to detect the magnetic field strength value of magnet 308, but may rely on the change in the magnetic field strength value of Earth's magnetic field.

In some implementations, upon detecting of the deviation from the initial baseline, sensor 400 may initiate an alarm to indicate that head assembly 104 has been tampered with. In some implementations, sensor 400 may output an audio signal via a speaker disposed in housing 110 or flash a bright light via a light source coupled to or disposed within housing 110. For example, when sensor 400 detects a magnetic field strength value that is a deviation from the initial baseline, sensor 400 may cause the speaker to output an alarm, such as a 130 dB alarm sound, or cause housing 110 to turn on or flash a light. In some implementations, the speaker may output an alarm sound having a decibel (dB) level between approximately 30 dB and approximately 150 dB, between approximately 60 dB and approximately 122 dB, or approximately 80 dB and approximately 100 dB. Sensor 400 may initiate the alarm to notify the owner that an intruder has tampered with head assembly 104. In some implementations, upon detecting of the deviation from the initial baseline, sensor 400 may notify a user via an application associated with security system 100 that is stored on an electronic device of the user.

In some implementations, sensor 400 may only initiate the alarm after a threshold has been reached. For example, sensor 400 may only output an audio signal or flash a light when sensor 400 detects a deviation from the initial baseline at a certain value, such as head assembly 104 being 0.5 cm from mounting plate 102 or housing 110 being rotated at least 5° relative to mounting plate 102. This is to ensure that slight movement of head assembly 104 or rotation of housing 110 does not result in an alarm sound. In some implementations, sensor 400 may include various thresholds based on the noise floor of sensors currently available. For example, sensor 400 may have a low threshold, such as approximately 0.1 inches or approximately 5°, a medium threshold, such as approximately 1 inch or approximately 7°, and a high threshold, such as 3 approximately inches or approximately 15°. In some implementations, sensor 400 may have thresholds between the low threshold, the medium, threshold, and the high threshold. For example, sensor 400 may have a threshold between approximately 0.1 inches to approximately 5 inches, approximately 5 inches to approximately 10 inches, or approximately 7 inches to approximately 15 inches and may have a threshold between approximately 5° to approximately 15°, approximately 10° to approximately 35°, approximately 20° to approximately 45°.

In some implementations, when sensor 400 detects a deviation greater than the low threshold, sensor 400 may notify the owner of the deviation via the application associated with security system 100. When sensor 400 detects a deviation greater than the medium threshold, sensor 400 may notify output audio signal to the speaker to sound an alarm and/or flash a bright light. When sensor 400 detects a deviation greater than the high threshold, sensor 400 may notify the owner and the authorities that an intruder has tampered with head assembly 104. In some implementations, security system 100 may be communicatively coupled to surrounding cameras such that when sensor 400 detects a deviation from a threshold value, the surrounding cameras rotate such that their field of view captures the field of view of security system 100. In some implementation, sensor 400 may detect motion of head assembly 104 based on a magnetic field strength value that is below a threshold value. When the magnetic field strength value that is detected is below the threshold value, sensor 400 may associate a timestamp with the recorded video at the timestamp, and may mark the video recording at the timestamp to indicate motion below the threshold value was detected by sensor 400.

In some implementations, the user may use an application associated with security system 100 to activate or deactivate sensor 400 and accelerometer 402. For example, the user may desire that they do not want to be notified about tamper events detected by security system 100, and thus may deactivate sensor 400 and accelerometer 402. When sensor 400 and accelerometer 402 are deactivated, the user will no longer be notified when sensor 400 detects deviations from an initial baseline or when accelerometer 402 detects acceleration. Further, when sensor 400 and accelerometer 402 are deactivated, alarms may not be initiated to notify the user about tamper events associated with security system 100.

In some implementations, a user may reset the initial baseline by re-positioning head assembly 104 and/or rotating housing 110. In some implementations, this change in orientation is communicated from sensor 400 to one or more user interfaces using a variety of different electronics and communications configurations. In some implementations, removal of head assembly 104 may result in the camera module being turned off due to the camera module being disconnected from a power source. In other implementations, the camera within housing 110 may be coupled to a battery disposed within housing 110. When sensor 400 detects substantial movement of head assembly 104, security system 100 may switch to the battery, such that removal of head assembly 104 from mounting plate 102, does not cause the camera module to stop recording due to loss of power. The camera module being connected to the battery may allow the camera module to continue recording video and/or audio when head assembly 104 has been removed from mounting plate 102. When head assembly 104 is returned to mounting plate 102, the camera module disposed within housing 110 may turn back on and switch to its original power source to preserve the battery. In some implementations, the battery is rechargeable by the original power source.

In some implementations, sensor 400 may act as a switch sensor to detect detachment of head assembly 104 from mounting plate 102. In some implementations, sensor 400 may detect a deviation from an initial magnetic field strength value of magnet 308, thereby indicating that head assembly 104 has been removed from mounting plate 102. In some implementations, sensor 400 may detect that head assembly 104 has been decoupled from mounting plate 102 by no longer detecting a magnetic field strength value associated with magnet 308. In some implementations, security system 100 may include an additional switch sensor to detect decoupling of head assembly 104 from mounting plate 102. The additional switch sensor may be configured to detect when head assembly 104 has been removed from mounting plate 102.

In some implementations, sensor 400 and magnet 308 may be used to indicate the position of head assembly 104 relative to mounting plate 102. For example, sensor 400 may detect a deviation from the initial baseline based on an initial reading of the magnetic field strength value of magnet 308. This deviation detected by sensor 400 may indicate a deviation in position of head assembly 104 relative to mounting plate 102 and thus a movement of head assembly 104 from an original position to a different position, thereby indicating the degree to which housing 110 of head assembly 104 has been rotated relative to mounting plate 102. In some implementations, sensor 400 may indicate the position of head assembly 104 based on deviations from an initial baseline based on the magnetic field strength value of Earth's magnetic field. For example, sensor 400 may detect a deviation from an initial baseline based on the magnetic field of Earth. This deviation detected by sensor 400 may indicate movement of head assembly 104 or rotation of housing 110 from an original position to a different position, thereby indicating the degree to which head assembly 104 has been moved or housing 110 has been rotated relative to mounting plate 102.

Figure 5:
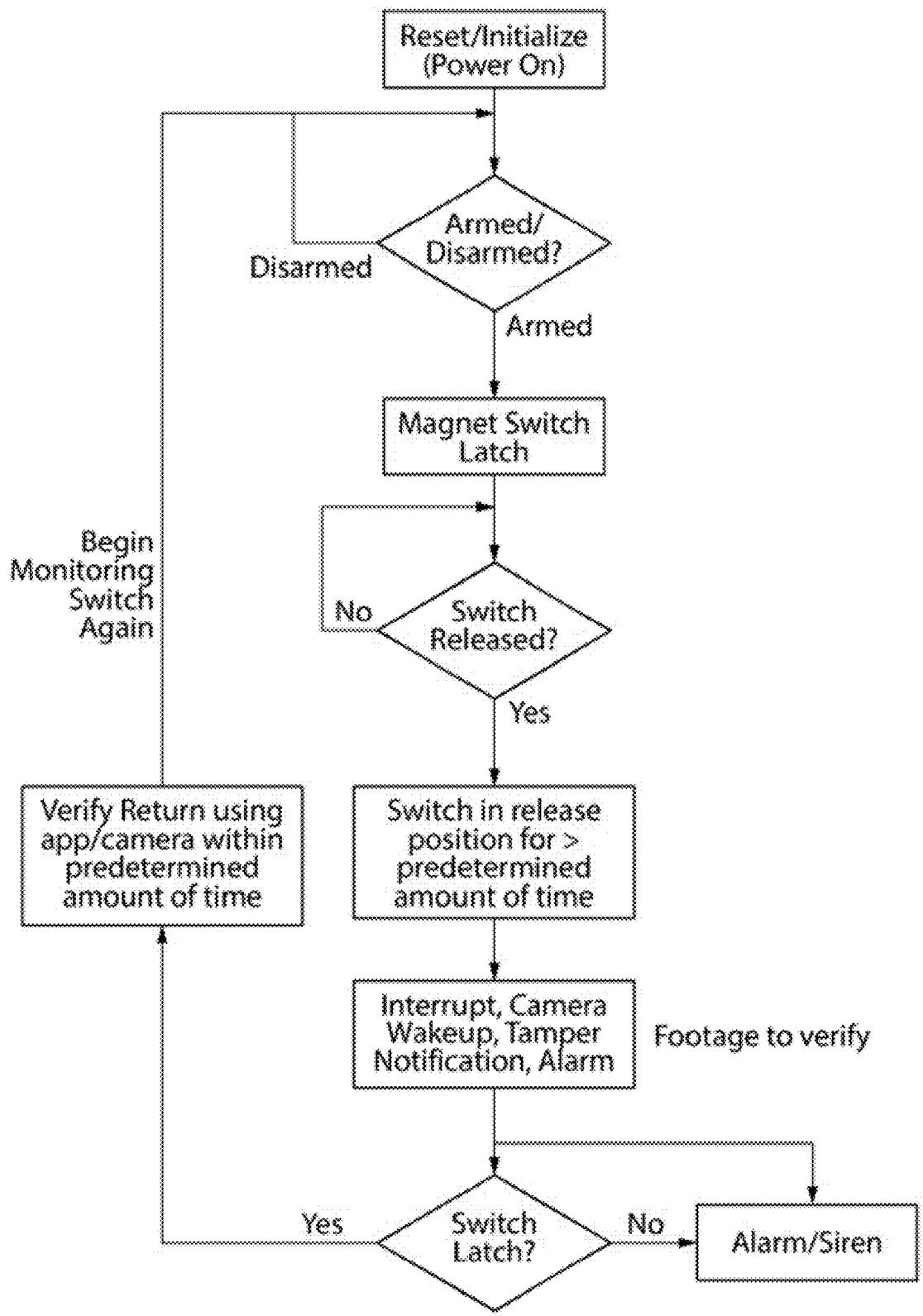
FIG. 5 is an example flowchart of an electronic device accordance with some implementations.

Referring to FIG. 5, a method of detecting a tamper event is shown. In some implementations, switch or sensor 400 alone, or sensor 400 in conjunction with accelerometer 402 may be powered on and armed by a user. For example, at the time of mounting security system 100, the user may arm security system 100, thereby arming sensor 400 and accelerometer 402. In some implementations, sensor 400 alone, or sensor 400 in conjunction with accelerometer 402 may be defaulted to be disarmed. In some implementations, sensor 400 acts like a magnetic switch sensor. When sensor 400 and accelerometer 402 are armed, sensor 400 may detect whether a magnetic field is present based on the distance of head assembly 104 relative to magnet 308 disposed within mounting plate 102.

In some implementations, sensor 400 continues to check for a detection of the magnetic field associated with magnet 308 at frequency of, for example, approximately 20 Hz. In some implementations, sensor 400 continues to check for a detection of the magnetic field associated with magnet 308 at frequency greater than 10 Hz. In some implementations, when sensor 400 no longer detects the magnetic field associated with magnet 308 or detects a deviation from the initial baseline, due to head assembly 104 decoupling from mounting plate 102, sensor 400 may initiate an alarm. In some implementations, sensor 400 only initiates an alarm when sensor 400 does not detect a magnetic field strength value or deviation for greater than a predetermined amount of time. When sensor 400 initiates an alarm, sensor 400 may activate camera module disposed within housing 110, sound an alarm, interrupt a recording function of the camera, or notify the user via an application associated with security system 100.

In some implementations, the camera disposed within housing 110 may begin recording to verify that an intruder is present and may relay this information to an application associated with an electronic device of the user. In some implementations, for the duration that sensor 400 detects that head assembly 104 has been moved due to deviations in the magnetic field strength value detected, sensor 400 may output the alarm. In some implementations, when head assembly 104 is re-coupled to mounting plate 102, sensor 400 may verify that head assembly 104 has been re-coupled by activating the camera or via the application. In some implementations, sensor 400 may begin monitoring deviations again once head assembly 104 is re-coupled.

Figure 6:
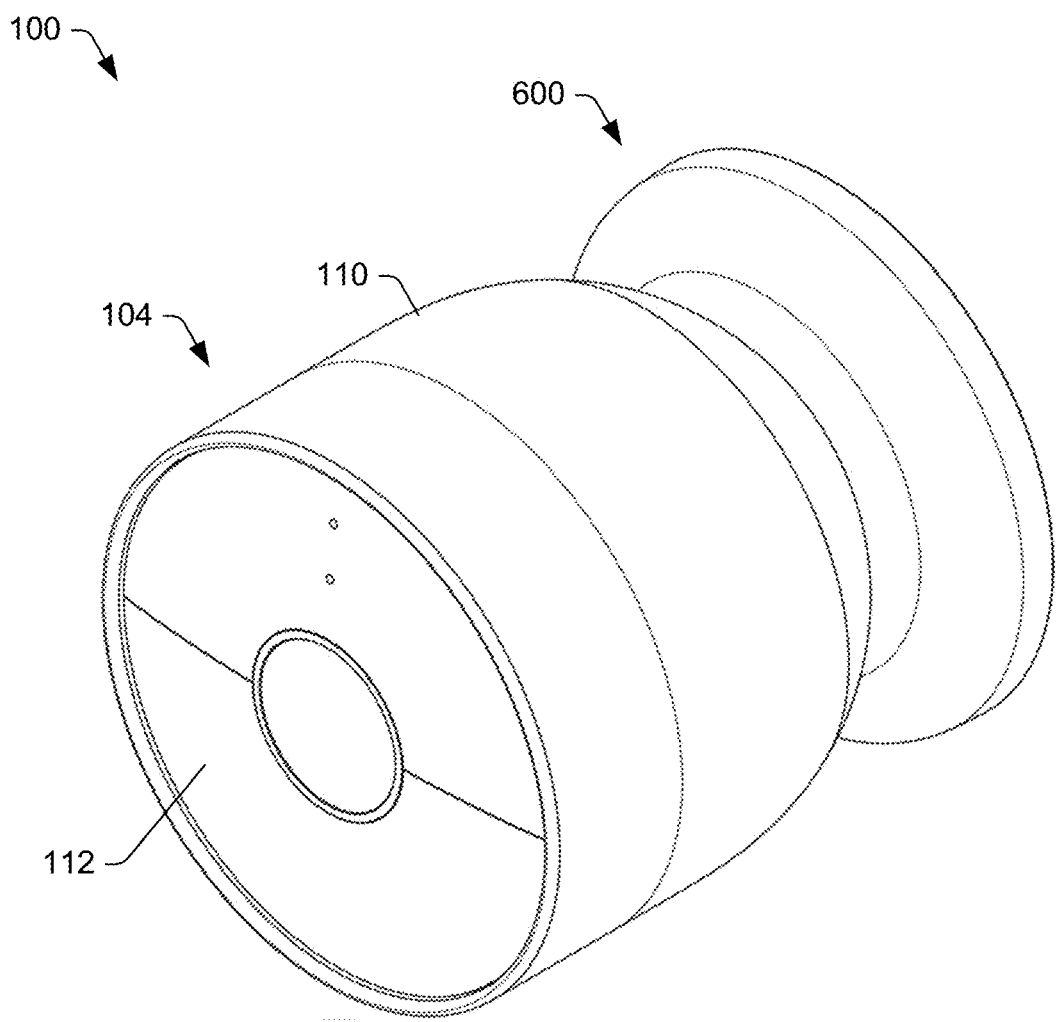
FIG. 6 is a perspective view of a system including an electronic device (e.g., the camera module from FIG. 1A) coupled to a magnetic mount in accordance with some implementations.

FIG. 6 is a perspective view of a system including an electronic device (e.g., the camera module from FIG. 1A) coupled to a magnetic mount in accordance with some implementations. The techniques, elements, systems, and components described with respect to FIGS. 1 through 5 may equally apply to the examples described in FIGS. 6 through 16. Likewise, the techniques, elements, systems, and components described with respect to FIGS. 6 through 16 may equally apply to the examples described in FIGS. 1 through 5. In the illustrated example, security system 100 having head assembly 104 includes housing 110, the front element 112, a sensor (e.g., sensor 400 from FIG. 5), and the camera module but does not include a stand (e.g., stand 108 from FIG. 1A). Rather, head assembly 104 may be removably and magnetically attached to a stand (e.g., mounting device 600), which may be interchangeable with other mounting devices that are different than mounting device 600. As described herein, because head assembly 104 is magnetically coupled to mounting device 600, the sensor (e.g., sensor 400 in FIG. 5) detects a magnetic field strength value associated with a magnet in mounting device 600. Further, due to the magnetic coupling between head assembly 104 and mounting device 600, head assembly 104 may be removed from a mounted position (e.g., magnetically coupled to mounting device 600) based on pull force acting on head assembly 104 in a direction opposite the magnetic pull force of the magnet in mounting device 600.

Figure 7:
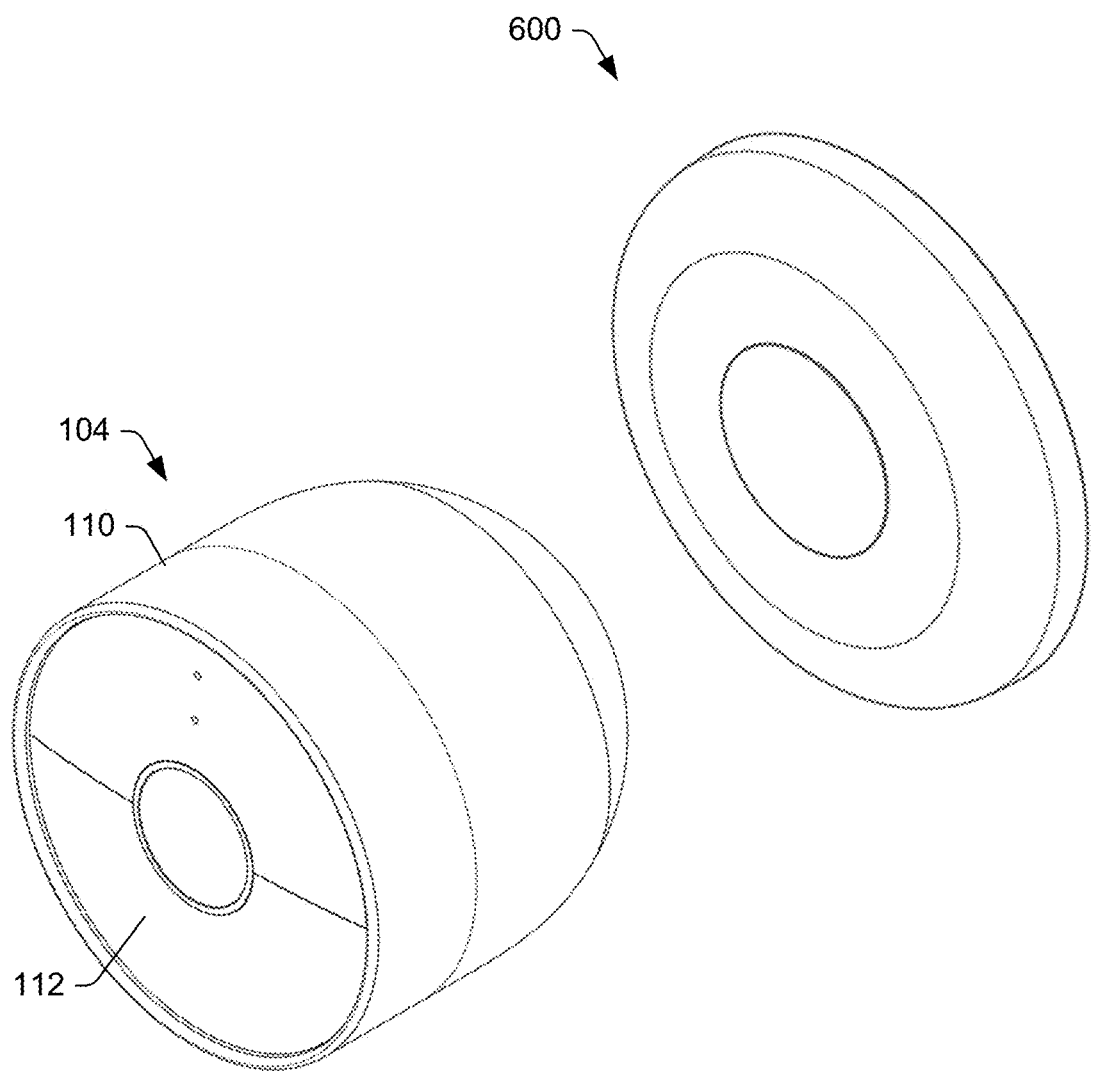
FIG. 7 is a perspective view of a system including the electronic device from FIG. 6 decoupled from the magnetic mount in accordance with some implementations.

FIG. 7 is a perspective view of a system including the electronic device from FIG. 6 decoupled from the magnetic mount in accordance with some implementations. As described herein, when head assembly 104 is decoupled from mounting device 600, the sensor (e.g., sensor 400 in FIG. 5) no longer detects the magnetic field strength value. Based on no longer detecting the magnetic field strength value associated with the magnet in mounting device 600, the sensor may determine that head assembly 104 is decoupled from mounting device 600. Further, the sensor may detect a privacy event based on the decoupling of head assembly 104 from mounting device 600. In some aspects, if tamper detection is disarmed when head assembly 104 is decoupled from mounting device 600, the sensor may associate the decoupling with the privacy event. When a privacy event is detected, the sensor deactivates the camera module to prevent unintentional recordings, including recordings while head assembly 104 is recharging. If head assembly 104 is reattached to mounting device 600, sensor 400 may detect the magnetic field strength value associated with the magnet in mounting device 600 and, based on the magnetic field strength value, determine that head assembly 104 has been recoupled (e.g., re-mounted) to mounting device 600 and that the privacy event has ended.

Figure 8A:
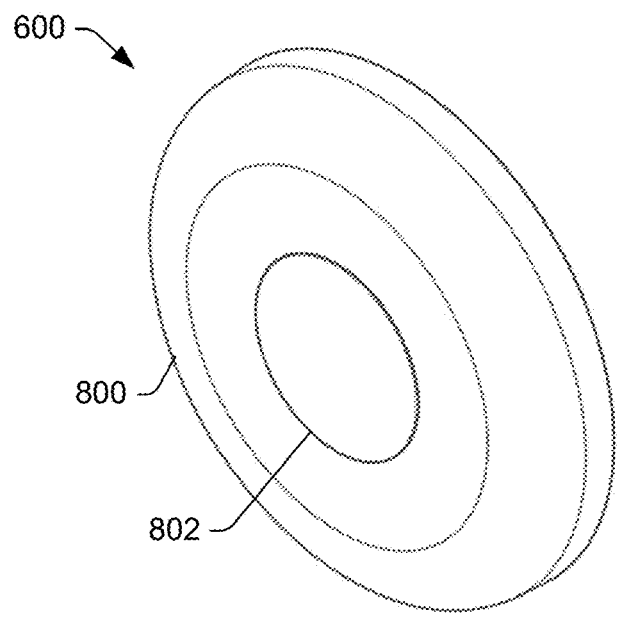
FIG. 8A is a right front perspective view of a mount in accordance with some implementations.
Figure 8B:
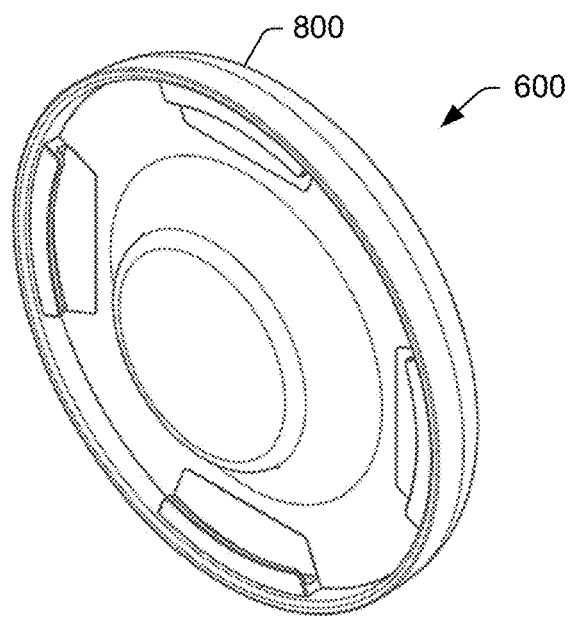
FIG. 8B is a left rear perspective view of the mount from FIG. 8A in accordance with some implementations.

FIG. 8A is a right front perspective view of a mount in accordance with some implementations. FIG. 8B is a left rear perspective view of the mount from FIG. 8A in accordance with some implementations. Mounting device 600 includes a cover 800 and a mounting surface 802. The mounting surface 802 may be flexible and concave to receive a portion of the continuously convexly curved exterior surface (e.g., exterior surface 116 shown in FIG. 1A) of head assembly (e.g., head assembly 104 from FIG. 6).

Figure 9:
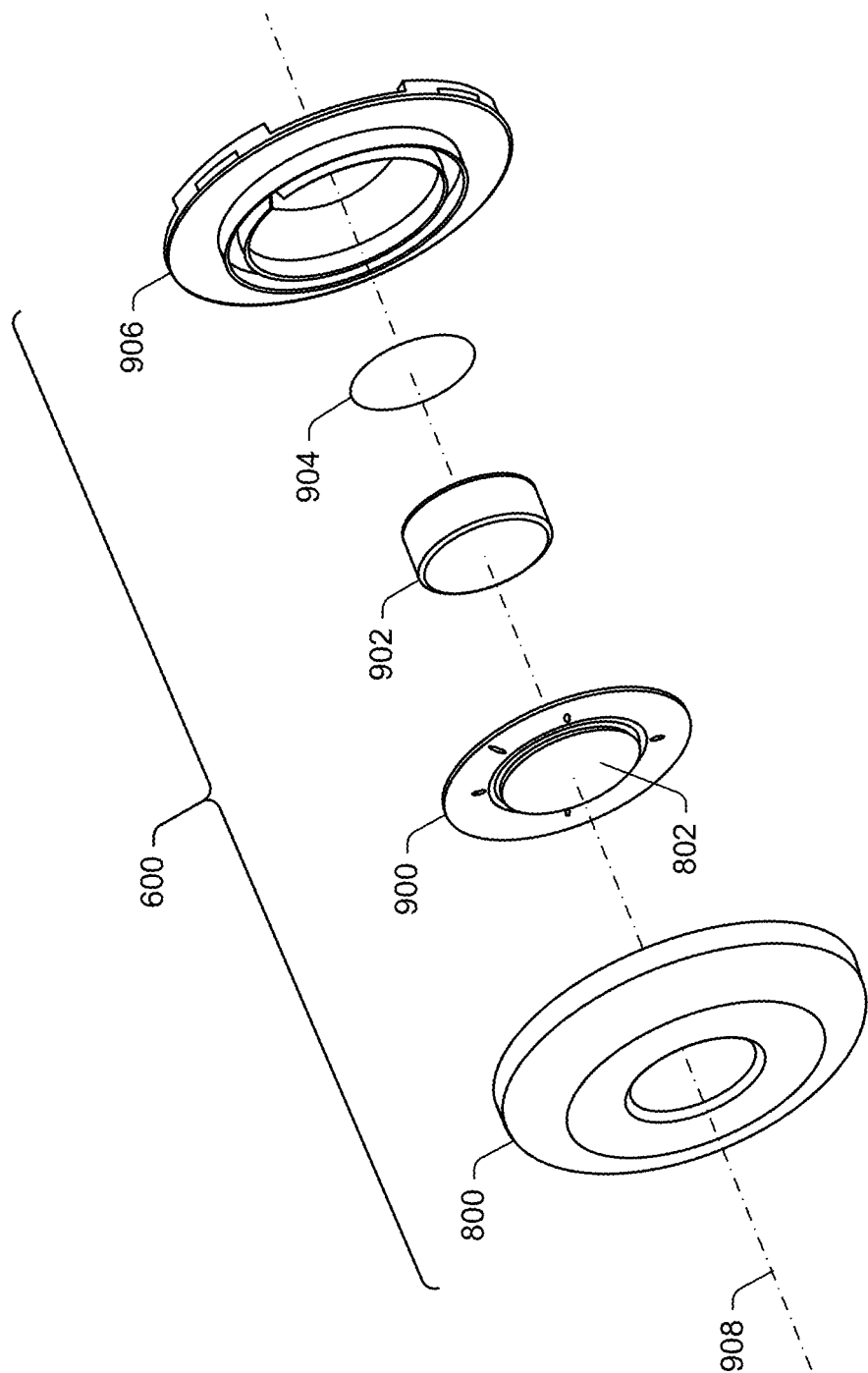
FIG. 9 is an exploded view of the mount from FIG. 8A in accordance with some implementations.

Continuing, FIG. 9 is an exploded view of the mounting device from FIG. 8A in accordance with some implementations. In the illustrated example, mounting device 600 includes front cover 800, a flexible mounting support 900 having mounting surface 802, a magnet 902, adhesive 904, and a rear cover 906. In some aspects, front cover 800, mounting support 900, magnet 902, and rear cover 906 are coaxially aligned in that they share a common axis (e.g., central axis 908).

Figure 10:
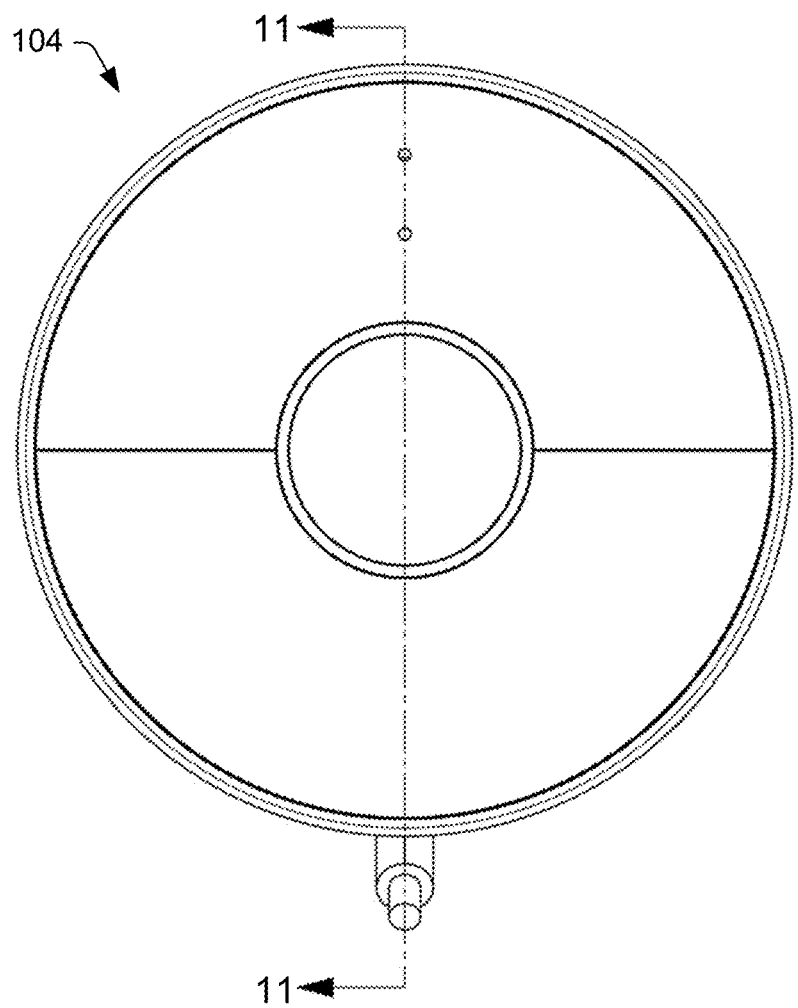
FIG. 10 is a front elevational view of the electronic device from FIG. 6.

FIG. 10 is a front elevational view of the electronic device from FIG. 6. In FIG. 10, head assembly 104 is coupled to the mounting device (hidden behind head assembly 104) in an orientation that is substantially normal to the mounting device. Additional details are shown in FIG. 11.

Figure 11:
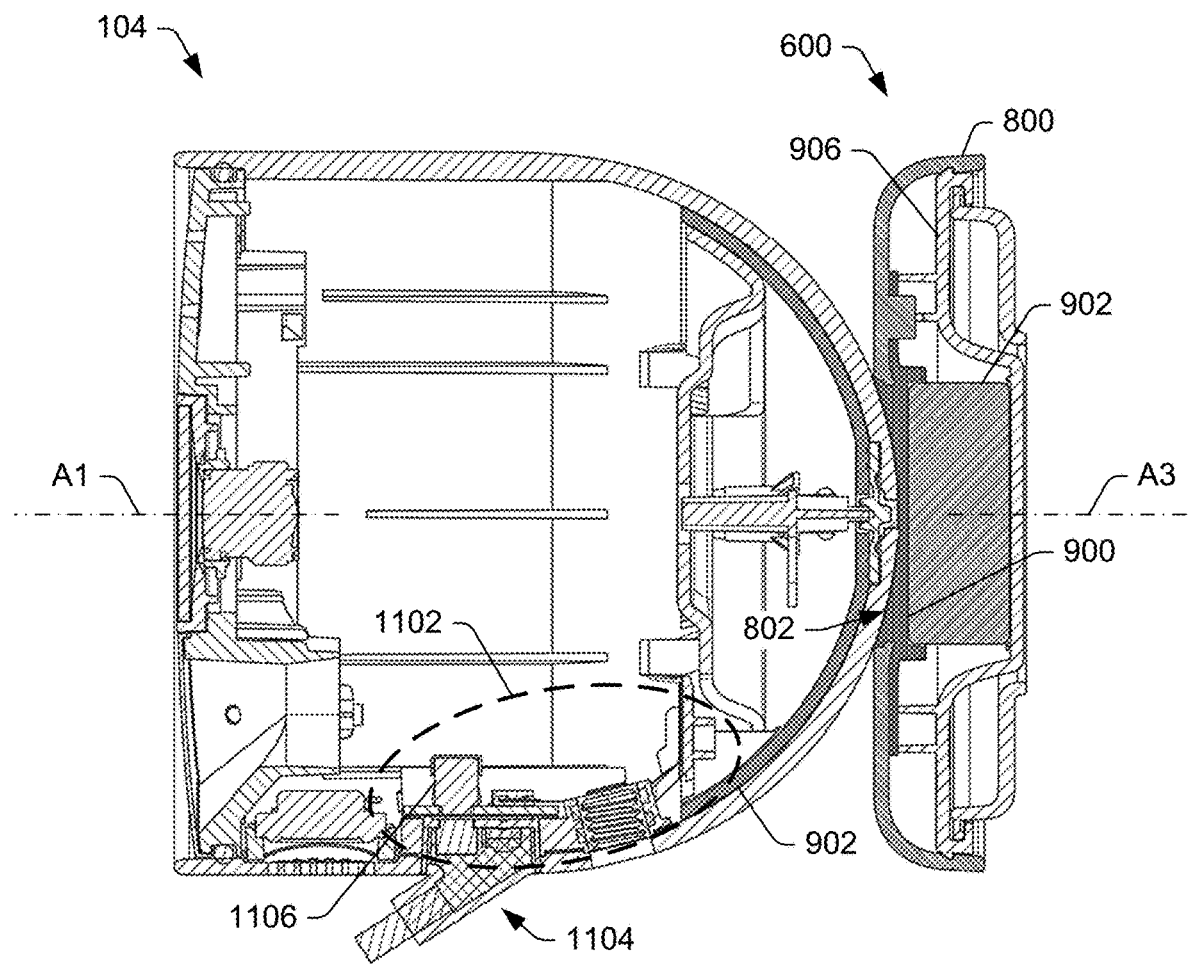
FIG. 11 is a sectional view of the electronic device in FIG. 10, taken along line 11-11 in accordance with some implementations.

FIG. 11 is a sectional view of the electronic device in FIG. 10, taken along line 11-11 in accordance with some implementations. In the example shown in FIG. 11, head assembly 104 is oriented such that central axis A1 of head assembly 104 is aligned (e.g., colinear) with a central axis (e.g., axis A3) of mounting device 600. To enable a magnetic coupling between head assembly 104 and mounting device 600, head assembly 104 includes a rear chassis 1100 that is ferromagnetic, which is attracted to magnets. The rear chassis 1100 is disposed within housing 110 proximate to a rounded end of housing 110 that is opposite front end 118 (shown in FIG. 1A). Magnet 902 attracts rear chassis 1100 sufficient to secure head assembly 104 against mounting surface 802 of mounting device 600. This is due to magnet 902 being positioned directly behind mounting support 900 that includes mounting surface 802.

In addition, head assembly 104 includes a connector subassembly 1102, which is configured to receive a coupler 1104 that connects a cable (e.g., charging cable) to head assembly 104. Connector subassembly 1102 is located on a lateral side of housing 110. Connector subassembly 1102 includes a connector magnet 1106 to provide a magnetic force that retains coupler 1104 against connector subassembly 1102. Coupler 1104 is described in more detail below.

Figure 12:
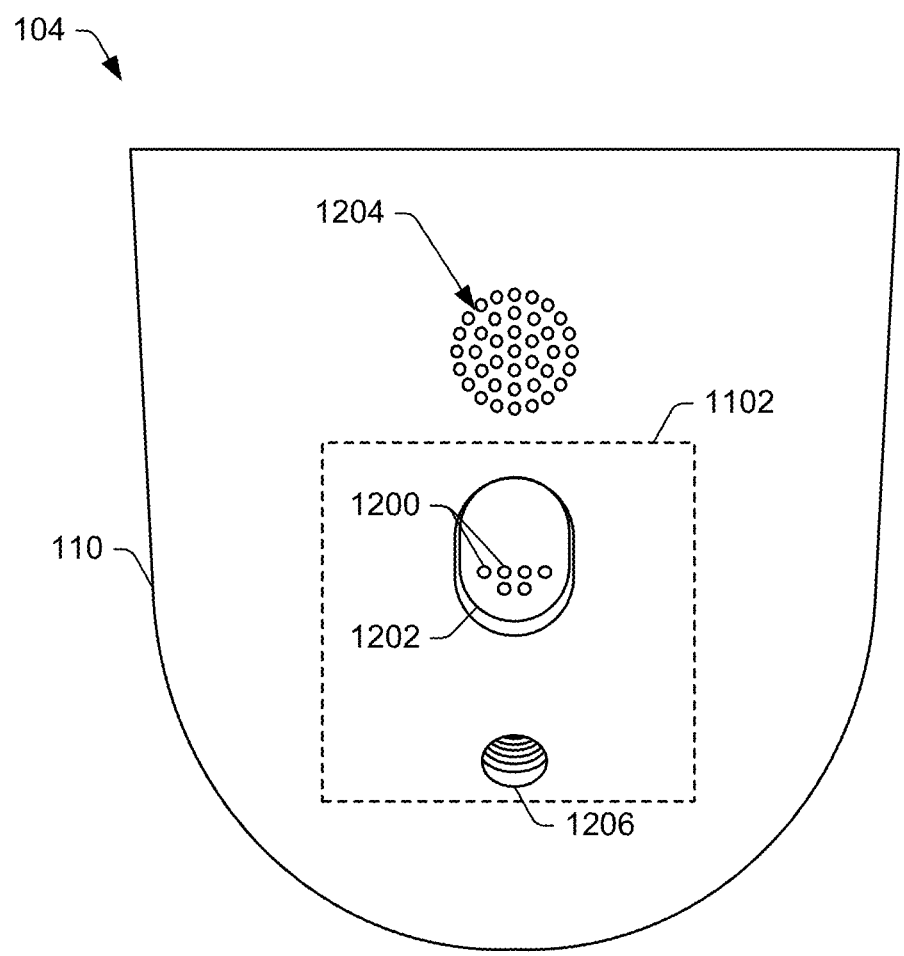
FIG. 12 is a bottom plan view of the electronic device from FIG. 6 in accordance with some implementations.

Continuing, FIG. 12 is a bottom plan view of the electronic device from FIG. 6 in accordance with some implementations. Connector subassembly 1102 is illustrated as including a plurality of contacts 1200 that are exposed to air and that are configured to directly contact pins (not shown) on coupler 1104. In aspects, contacts 1200 are part of a printed circuit board located inside head assembly 104 to reduce the distance between the printed circuit board and conductive pins on coupler 1104 (described with respect to FIG. 13). This reduced distance reduces losses associated with electrical resistance in the materials. Any suitable number of contacts 1200 may be implemented (e.g., 2, 3, 4, 5, 6, 7, 8, and so forth) in any suitable pattern or distribution. In the example shown, the contacts 1200 are arranged in two subsets (e.g., rows). A first subset of contacts may include four contacts in a first row and a second subset of contacts may include two contacts in a second row.

In an implementation, the four contacts in the first row may be used to perform USB negotiation to detect a level of charge needed by the electronic device. The two additional contacts in the second row may be used for accessory detection. For example, different accessory devices (e.g., wall mount, floodlight, tabletop mount) may have different resistor values, which can be used by the electronic device to determine information corresponding to the connected accessory device. In this way, the electronic device may perform automatic setup for a particular accessory device rather than requiring input from the end user for the setup.

If, for instance, a third party solar panel is electrically connected to head assembly 104, the electronic device may detect a first resistor value, identify the solar panel based on the first resistor value being associated with the solar panel, and then adjust a function, including a function associated with power consumption due to a determination that the electronic device is not receiving constant power but is receiving some power. In another example, the electronic device may detect a second resistor value, which is associated with a table stand, identify the table stand based on the second resistor value, and adjust a function based on the connection to the table stand. In yet another example, the electronic device may detect a third resistor value, which is associated with a wall mount (e.g., mounting device 600), identify the wall mount based on the third resistor value, and adjust a function based on the connection to the wall mount. Such a function for any of the described examples may include activating the camera module, adjusting (e.g., increasing or decreasing) a brightness of one or more LEDs, adjusting (e.g., increasing or decreasing) a time between motion detection operations, increasing a length of a video clip recording to enable additional recordings if additional power is available for consumption, decreasing the length of the video clip recording to conserve power, and so forth. Because contacts 1200 are exposed to air, contacts 1200 may include a corrosion-resistant material (e.g., gold plating). In addition, head assembly 104 includes a color-matching material 1202 (e.g., mylar) that surrounds each conductive contact 1200 and provides a protective layer for connector subassembly 1102.

In addition, the electronic device may infer indoor/outdoor use (e.g., whether the electronic device is being used indoors or outdoors) based on an attachment type detected via contacts 1200. In an example, if the electronic device detects a solar panel connected to head assembly 104, the electronic device may infer outdoor use (based on an assumption that solar panels are used outdoors) and then proceed with the sensor-based privacy-event detection as described herein. In another example, if the electronic device infers indoor use, then the electronic device may disable the sensor-based privacy detection to continue recording images and/or video regardless of whether head assembly 104 is decoupled from magnet mount 600. The electronic device may infer indoor use or outdoor use based on any suitable attachment type via contacts 1200, including a light (e.g., a floodlight, a lamp), a solar panel, a speaker, a display screen, an access point, a wall mount, and so on.

The electronic device may use additional sensor signals and data to infer indoor/outdoor use. In aspects, objects identified in captured images or video by the camera module can be used to infer indoor/outdoor use. For example, if one or more objects are identified that are typically located outdoors (e.g., trees, a sidewalk, a street, an automobile, grass, a parking lot, and so forth), then the electronic device may infer that it is being used outdoors. If one or more objects are identified that are typically located indoors (e.g., walls, furniture, hallways, and so forth), then the electronic device may infer that it is being used indoors. In an aspects, the electronic device may utilize an audio sensor to detect sounds that may provide an indication of indoor or outdoor use. For example, outdoor use may be inferred based on certain sounds including sounds of, e.g., a moving vehicle, a dog barking in the distance, rain, wind, a vehicle horn, emergency vehicle sirens, traffic, and so on. Indoor use may be inferred based on certain sounds including sounds of, e.g., music, appliances, a television, and so on. A volume level of the sounds may be used to infer indoor or outdoor use. For example, a higher level of detected sound volume (e.g., 70 dB or more) may indicate an outdoor location, whereas a lower level (e.g., less than 70 dB) of detected sound volume may indicate an indoor location.

The electronic device may use radar data to infer indoor/outdoor use. For example, motion detection may be used to infer outdoor use if, for example, motion is detected for large objects (e.g., vehicles), at high speeds (e.g., a bird flying past), and/or with high frequency over a duration of time (e.g., 30 or more moving objects within one minute). In implementations, motion detection may be used to infer indoor use if, for example, motion is detected with low frequency over a duration of time (e.g., less than 30 moving objects within one minute). Other sensor data that may be used to infer indoor/outdoor use may include humidity level, ambient light (e.g., direct sunlight versus fluorescent light, incandescent light, or light from a fire), ambient temperature, atmospheric pressure, vibration, and so forth. Changes in the sensor data may also be used to infer indoor/outdoor use. Any suitable combination of sensor data may be utilized to infer whether the electronic device is being used indoors or outdoors. In aspects, the inference is made at a time of coupling head assembly 104 to the mounting device (e.g., mounting device 600, mounting plate 102, mounting stand 108). In some aspects, the inference may be made when coupler 1104 is electrically connected to head assembly 104 and the electronic device detects an accessory device. In another aspect, the indoor/outdoor inference may be made at the time of a detected event (e.g., tamper event, privacy event).

In some implementations, if the electronic device determines a tamper event, the camera module may continue recording regardless of whether a privacy event is detected. In another aspect, if the electronic device determines that a tamper event has not occurred, infers that the electronic device is outdoors, and detects that head assembly 104 is decoupled from mounting device 600, then the electronic device may determine that a privacy event has occurred and responsively disable the camera module to stop recording images or video.

As illustrated, head assembly 104 may also include perforations (e.g., a hole pattern 1204) in housing 110. The perforations 1204 are aligned with a speaker module disposed within housing 110 to enable passage of audio waves generated by the speaker module. In addition, head assembly 104 includes a threaded insert 1206, which may be used to attach head assembly 104 to a suitable mounting device (e.g., a tripod, tabletop stand).

Figure 13:
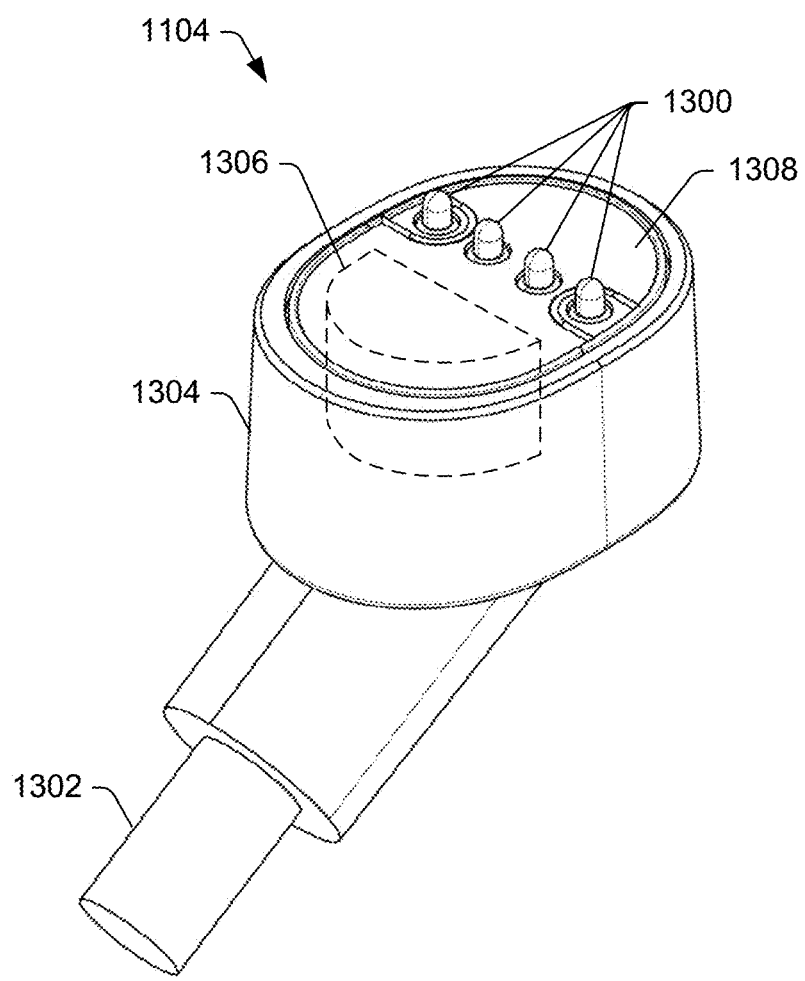
FIG. 13 is a right front perspective view of an example coupler that electrically connects a cable to the electronic device from FIG. 6.
Figure 14:
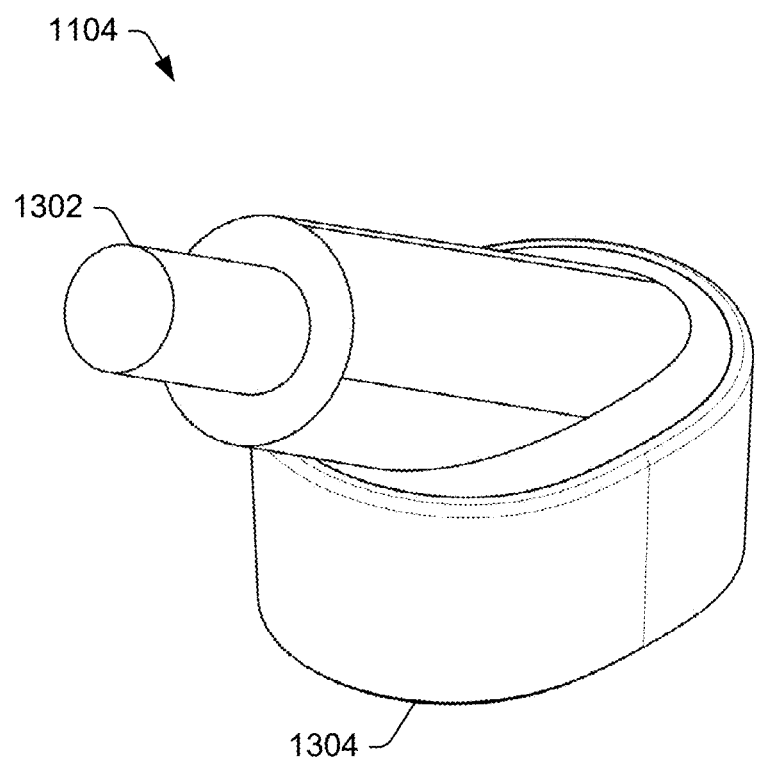
FIG. 14 is a left rear perspective view of the example coupler from FIG. 13.

FIGS. 13 and 14 illustrate an example coupler that connects to connector subassembly 1102 on head assembly 104. In particular, FIG. 13 is a right front perspective view of an example coupler that electrically connects a cable to the electronic device from FIG. 6. Further, FIG. 14 is a left rear perspective view of the example coupler from FIG. 13. Coupler 1104 includes a plurality of pins 1300 (e.g., pogo pins) configured to directly abut the contacts (e.g., contacts 1200 in FIG. 12) of connector subassembly 1102. In FIG. 13, coupler 1104 is illustrated as having four pogo pins (e.g., pins 1300), which may be used, for example, for ground, data in, data out, and bus voltage (Vbus). However, any suitable number of pins 1300 may be implemented to supply power and transfer data. As described, coupler 1104 is configured to connect a cable (e.g., cable 1302) to head assembly 104. In addition, coupler 1104 includes a shell 1304 and a coupler magnet 1306 disposed within shell 1304. Coupler magnet 1306 magnetizes with connector magnet 1106 to retain coupler 1104 to connector subassembly 1102. In addition, coupler 1104 includes a cover material 1308 (e.g., mylar) forming a substantially planar surface. In aspects, cover material 1308 covers coupler magnet 1306 and includes holes through which pins 1300 extend. Cover material 1308 is non-conductive and may provide a corrosion-resistant layer to protect coupler magnet 1306 from the environment.

Although the illustrated examples show magnets in both coupler 1104 and connector subassembly 1102, some implementations may include a single magnet. For example, coupler 1104 may include a magnetizable material in lieu of coupler magnet 1306, where the magnetizable material is attracted to connector magnet 1106 in connector subassembly 1102 to magnetically retain coupler 1104 to connector subassembly 1102. In another example, connector subassembly 1102 may include a magnetizable material in lieu of connector magnet 1106, where the magnetizable material in connector subassembly 1102 is magnetically attracted to coupler magnet 1306 in coupler 1104 to magnetically retain coupler 1104 to connector subassembly 1102.

Figure 15:
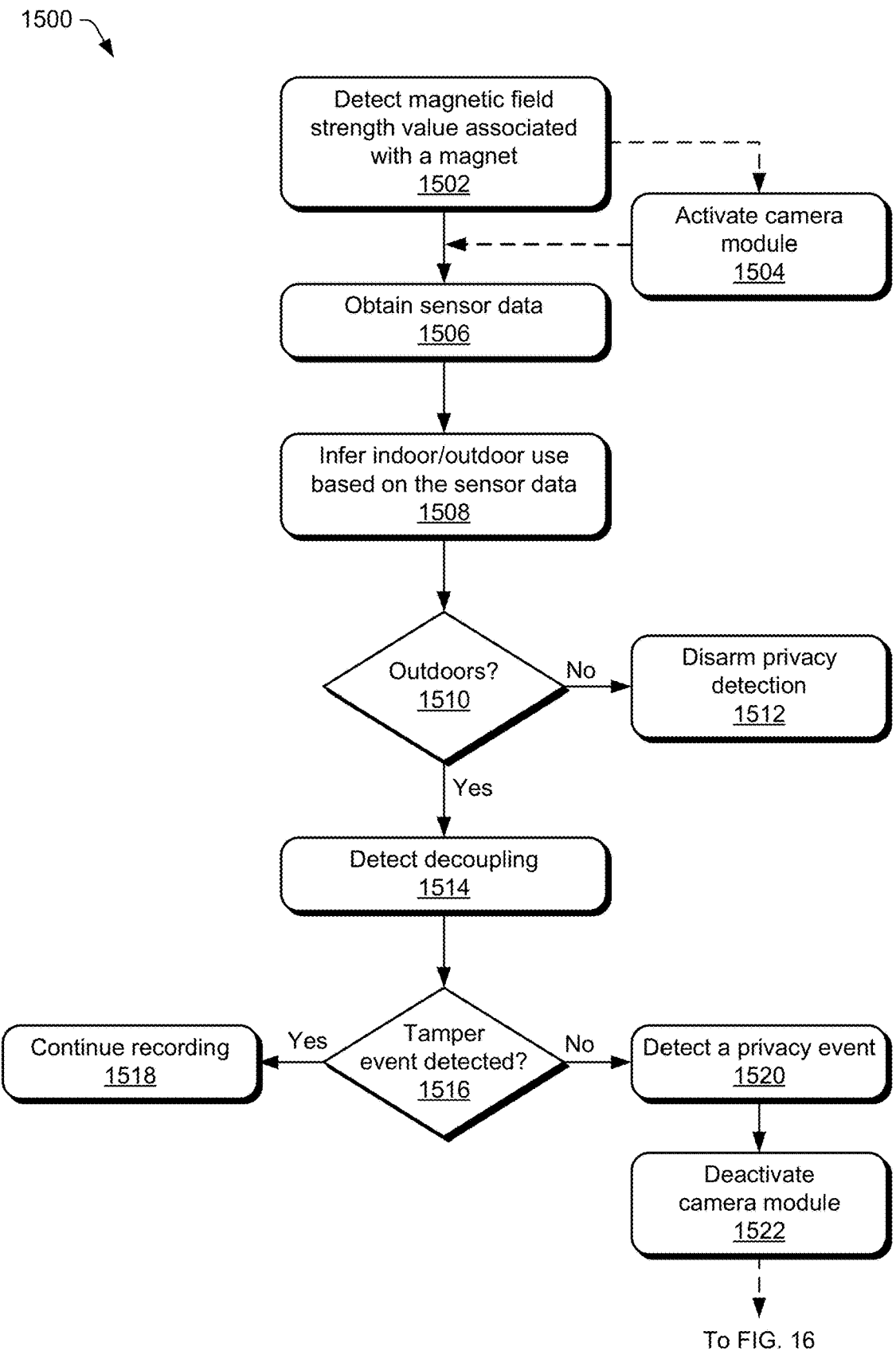
FIG. 15 depicts a method for detecting a privacy event associated with an electronic device having a head assembly removably and magnetically coupled to a mounting device.

FIG. 15 depicts a method for detecting a privacy event associated with an electronic device having a head assembly removably and magnetically coupled to a mounting device. The method described in FIG. 15 is shown as a set of blocks that specify operations performed but are not necessarily limited to the order or combinations shown for performing the operations by the respective blocks. Further, any of one or more of the operations may be repeated, combined, reorganized, or linked to provide a wide array of additional and/or alternate methods. In portions of the following discussion, reference may be made to the example security system 100 of FIGS. 1A through 4, the example electronic device of FIGS. 6 and 7, and/or to components as detailed in FIGS. 8 through 14, reference to which is made for example only. The techniques are not limited to performance by one entity or multiple entities operating on one device.

At 1502, a magnetic field strength value associated with a magnet is detected when the head assembly is coupled to the mounting device. For example, when head assembly 104 is removably and magnetically coupled to mounting device 600, sensor 400 detects the magnetic field strength value associated with magnet 902 in mounting device 600.

Optionally, at 1504 the camera module is activated. For example, if the camera module is not already activated, then sensor 400 can activate the camera module or signal a main logic board (MLB) in head assembly 104 to activate the camera module. However, if the camera module is already activated, then 1504 may be skipped and the method 1500 may proceed directly to 1506.

At 1506, sensor data is obtained. Any suitable sensor data may be obtained, which is usable to infer whether the electronic device is located indoors or outdoors. Example sensor data includes image data, audio data, radar data, ambient light data, barometric sensor data, humidity level, ambient temperature, vibration data, connected accessory device information, and so forth.

At 1508, the electronic device uses at least some of, including any suitable combination of, the sensor data to infer indoor/outdoor use. For example, the electronic device can infer that it is indoors or outdoors based on which type of accessory device is attached to head assembly 104, what types of sounds are detected, what type of ambient light is detected, what types of objects are identified in captured images or video, and so forth.

At 1510, the electronic device determines whether the inference is outdoors. If the inference is indoors ("NO" at 1510), then at 1512 the electronic device disarms the sensor-based privacy-event detection. In some cases, the sensor-based privacy-event detection is disarmed based on an assumption that the device owner is not concerned with stopping image capture or video recording for privacy events occurring in their own home. If the inference is outdoors ("YES" at 1510), then the method 1500 proceeds to 1514. As an alternative, the electronic device may instead determine whether the inference is indoors and the method may then proceed to 1512 if the inference is indoors or to 1514 is the inference is outdoors.

At 1514, the head assembly is determined to be decoupled from the mounting device in response to no longer detecting the magnetic field strength value associated with the magnet. For example, sensor 400 no longer detects the magnetic field strength value associated with magnet 902 and responsively determines that head assembly 104 is decoupled from mounting device 600.

At 1516, the electronic device determines whether a tamper event has occurred. For example, the electronic device may determine whether the decoupling of head assembly 104 from mounting device 600 is associated with a tamper event based on whether tamper detection is disarmed or armed at the time of the decoupling. The occurrence of a tamper event may be determined by performing at least some of the method described above with respect to FIG. 5. If tamper detection is armed and the electronic device detects a tamper event ("YES" at 1516), then at 1518 the camera module continues recording images or video.

However, if a tamper event is not detected (e.g., tamper detection is disarmed, accelerometer 402 is disarmed), then the electronic device determines that the decoupling is not a tamper event ("NO" at 1516) and at 1520 the electronic device detects a privacy event. Accordingly, sensor 400 may use the determination of the decoupling of head assembly 104 from mounting device 600 as evidence of a privacy event if the tamper detection is disarmed and the electronic device is inferred to be outdoors.

At 1522, the camera module is deactivated responsive to detecting the privacy event. For example, sensor 400 may deactivate, or signal the MLB to deactivate, the camera module in response to detecting the privacy event. By deactivating the camera module according to a privacy event (e.g., user removes head assembly 104 for recharging), unintentional recordings by the camera module are prevented.

Figure 16:
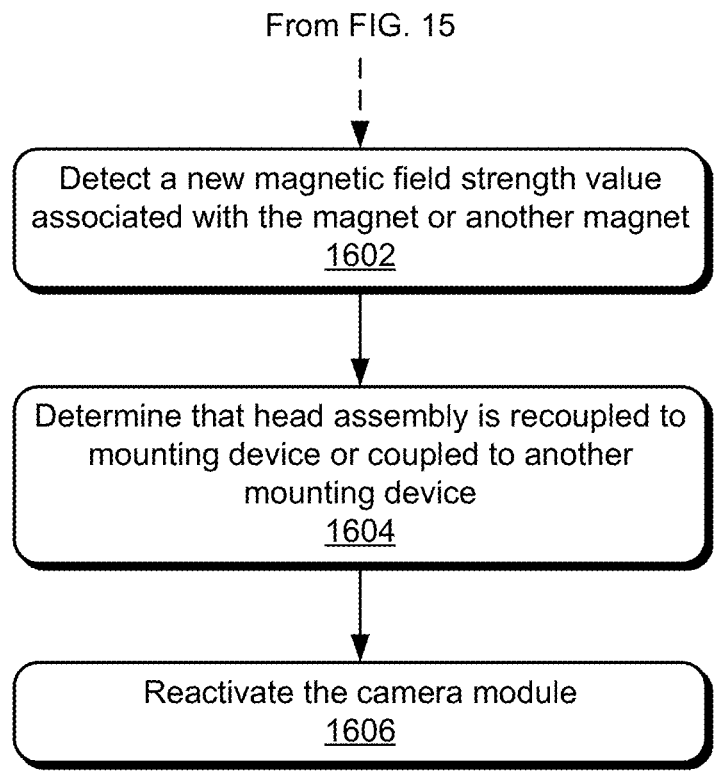
FIG. 16 depicts a method for reactivating the camera module subsequent to a detected privacy event.

Optionally, the method 1500 may continue to method 1600 in FIG. 16. FIG. 16 depicts a method 1600 for reactivating the camera module subsequent to a detected privacy event.

Subsequent to detection of a privacy event using the method 1500 in FIG. 15 and deactivating the camera module at 1522, sensor 400, at 1602 detects a new magnetic field strength value associated with the magnet or another magnet. Then, at 1604, sensor 400 determines that head assembly 104 has been recoupled to mounting device 600 or coupled to another mounting device based on the detecting of the magnetic field strength value associated with the magnet or the other magnet. For example, if the end user places head assembly 104 back onto mounting device 600, sensor 400 again detects the magnetic field strength value associated with magnet 902 and uses that detection to determine that head assembly 104 has been recoupled to mounting device 600. In another example, if the end user places head assembly 104 onto a different magnetic mounting device, sensor 400 may detect a new magnetic field strength value that is different than the magnetic field strength value associated with magnet 902 in mounting device 600 and sensor 400 may use the detection of the new magnetic field strength value to determine that head assembly 104 has been coupled to the different mounting device. Further information used to detect the different mounting device may be obtained via coupler 1104 providing signals associated with a different accessory device. Additional sensor data may be used to detect a change in location (e.g., indoors to outdoors, outdoors to indoors) of the electronic device in comparison to the electronic device's previous location prior to the privacy event.

At 1606, the camera module is reactivated in response to the determination that head assembly 104 has been recoupled to a mounting device. For example, sensor 400 activates, or signals the MLB in head assembly 104 to activate, the camera module in response to determining that head assembly 104 is recoupled to mounting device 600 or coupled to another mounting device.

Generally, any of the components, modules, methods, and operations described herein can be implemented using software, firmware, hardware (e.g., fixed logic circuitry), manual processing, or any combination thereof. Some operations of the example methods may be described in the general context of executable instructions stored on computer-readable storage memory that is local and/or remote to a computer processing system, and implementations can include software applications, programs, functions, and the like. Alternatively or in addition, any of the functionality described herein can be performed, at least in part, by one or more hardware logic components, including, and without limitation, Field-programmable Gate Arrays (FPGAs), Application-specific Integrated Circuits (ASICs), Application-specific Standard Products (ASSPs), System-on-a-chip systems (SoCs), Complex Programmable Logic Devices (CPLDs), and the like.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. As an example, the techniques, components, elements, and systems described with respect to FIGS. 1 through 16 may be combined in any suitable manner. The implementations were chosen in order to best explain the principles underlying the claims and their practical applications, to thereby enable others skilled in the art to best use the implementations with various modifications as are suited to the particular uses contemplated.

What is claimed is:

1. A method comprising:
   detecting, via a sensor disposed within an electronic device having a head assembly, a magnetic field strength value associated with a magnet in a mounting device when the head assembly is removably and magnetically coupled to the mounting device;
   responsive to no longer detecting the magnetic field strength value associated with the magnet, determining that the head assembly is decoupled from the mounting device;

determining, based on an indication that a tamper detection of the electronic device is disarmed, that the decoupling of the head assembly from the mounting device is not a tamper event;
associating the decoupling of the head assembly from the mounting device with an occurrence of a privacy event based on the determination that the decoupling of the head assembly from the mounting device is not a tamper event; and
responsive to the occurrence of the privacy event, deactivating a camera module disposed within the electronic device.

2. The method of claim 1, further comprising, responsive to detecting the magnetic field strength value associated with the magnet, activating the camera module to capture images of a scene.

3. The method of claim 1, further comprising, subsequent to deactivating the camera module:
detecting a new magnetic field strength value associated with the magnet or another magnet;
determining that the head assembly has been recoupled to the mounting device or coupled to another mounting device based on detecting the new magnetic field strength value associated with the magnet or the other magnet; and
responsive to determining that the head assembly has been recoupled to the mounting device or coupled to the other mounting device, reactivating the camera module.

4. The method of claim 1, wherein the sensor comprises one of a magnetometer, a magnetoresistive sensor, and a Hall effect sensor.

5. The method of claim 1, further comprising:
obtaining sensor data from one or more additional sensors; and
inferring, based on the sensor data, whether the electronic device is located indoors or outdoors.

6. The method of claim 5, further comprising:
wherein associating the decoupling of the head assembly from the mounting device with the privacy event is responsive to determining that the decoupling of the head assembly from the mounting device is not a tamper event and based on an inference that the electronic device is outdoors.

7. The method of claim 1, further comprising, detecting a signal, via a connector subassembly located on the head assembly, from a coupler directly connected to the connector subassembly, the connector subassembly having contacts that are exposed to air and that directly contact pins on the coupler to receive electrical signals.

8. The method of claim 7, wherein the connector subassembly includes a printed circuit board and wherein the contacts are part of the printed circuit board.

9. The method of claim 7, further comprising using a first subset of the contacts for USB negotiation and a second subset of the contacts for accessory detection and identification.

10. The method of claim 9, further comprising:
detecting, using the second subset of the contacts, a resistor value; and
identifying which accessory device from a plurality of accessory devices is connected to the head assembly based on the resistor value being associated with the accessory device.

11. The method of claim 10, further comprising adjusting a function based on which accessory device is identified as being connected to the head assembly.

12. The method of claim 10, wherein adjusting a function includes decreasing a time between motion detection or increasing a length of a video clip recording.

13. The method of claim 10, wherein adjusting a function includes increasing a brightness of one or more light-emitting diodes, LEDs.

14. The method of claim 1, further comprising notifying an end user having an application associated with the electronic device of the occurrence of the privacy event and that the head assembly has been decoupled from the mounting device.

15. The method of claim 1, wherein a privacy event represents an intentional decoupling of the head assembly from the mounting device by a user of the electronic device.

16. An electronic device comprising:
a head assembly configured to be removably and magnetically coupled to a mounting device having a magnet, the head assembly including:
a housing;
a camera module disposed within the housing and configured to capture images or video; and
a sensor disposed within the housing, the sensor configured to detect a magnetic field strength value associated with the magnet; and
at least one electronic circuit configured to:
determine that the head assembly is decoupled from the mounting device responsive to the sensor no longer detecting the magnetic field strength value associated with the magnet;
receive an indication that a tamper detection of the electronic device is disarmed;
based on a determination that the tamper detection of the electronic device is disarmed when the head assembly is decoupled from the mounting device, determine that a privacy event has occurred; and
deactivate the camera module responsive to the determination that the privacy event has occurred.

17. The electronic device of claim 16, wherein the at least one circuit is further configured to activate the camera module, responsive to detection of the magnetic field strength value associated with the magnet.

18. The electronic device of claim 16, wherein the at least one circuit is further configured to:
detect a new magnetic field strength value associated with the magnet or another magnet;
determine that the head assembly has been recoupled to the mounting device or coupled to another mounting device based on detecting the new magnetic field strength value associated with the magnet or the other magnet; and
responsive to a determination that the head assembly has been recoupled to the mounting device or coupled to the other mounting device, reactivate the camera module.

19. The electronic device of claim 16, further comprising a connector assembly located on the head assembly, wherein the connector assembly includes a printed circuit board having contacts that are exposed to air and that directly contact pins on a coupler directly connected to the connector assembly to receive electrical signals.

20. The electronic device of claim 19, wherein the contacts include:
a first subset of the contacts for USB negotiation; and
a second subset of the contacts for accessory detection and identification.

21. The electronic device of claim 20, wherein the at least one circuit is further configured to:

detect, via the second subset of the contacts, a resistor value;
identify which accessory device from a plurality of accessory devices is connected to the head assembly based on the resistor value being associated with the accessory device; and
adjust a function based on which accessory device is identified as being connected to the head assembly.

* * * * *